United States Patent
Sampson et al.

(10) Patent No.: US 10,607,458 B1
(45) Date of Patent: Mar. 31, 2020

(54) CHIME CONTROL COMPANION AND COMMUNICATION

(71) Applicant: Kuna Systems Corporation, San Bruno, CA (US)

(72) Inventors: Harold G. Sampson, Sunnyvale, CA (US); Noah Washington, San Mateo, CA (US)

(73) Assignee: KUNA SYSTEMS CORPORATION, San Bruno, CA (US)

( * ) Notice: Subject to any disclaimer, the term of this patent is extended or adjusted under 35 U.S.C. 154(b) by 0 days.

(21) Appl. No.: 16/420,844

(22) Filed: May 23, 2019

Related U.S. Application Data

(63) Continuation-in-part of application No. 16/143,853, filed on Sep. 27, 2018, now Pat. No. 10,389,983, which is a continuation-in-part of application No. 16/111,669, filed on Aug. 24, 2018, now Pat. No. 10,389,982.

(60) Provisional application No. 62/807,996, filed on Feb. 20, 2019, provisional application No. 62/789,113, filed on Jan. 7, 2019, provisional application No. 62/661,341, filed on Apr. 23, 2018.

(51) Int. Cl.
  *G08B 3/10* (2006.01)
  *H03K 5/24* (2006.01)
  *H02H 9/02* (2006.01)

(52) U.S. Cl.
  CPC ............. *G08B 3/10* (2013.01); *H02H 9/025* (2013.01); *H03K 5/2472* (2013.01)

(58) Field of Classification Search
  CPC ..................................................... G08B 3/10
  See application file for complete search history.

(56) References Cited

U.S. PATENT DOCUMENTS

| | | | | |
|---|---|---|---|---|
| 10,311,685 B1* | 6/2019 | Long | ................. | G08B 3/10 |
| 2011/0090068 A1* | 4/2011 | Langer | ............... | G08B 3/10 |
| | | | | 340/333 |
| 2012/0323508 A1* | 12/2012 | Vilas Boas | .......... | G01R 19/32 |
| | | | | 702/60 |

(Continued)

OTHER PUBLICATIONS

Ring Product Team, "How to Bypass your Internal Doorbell with the Pro Power Kit V2", https://support.ring.com/he/en-us/articles/115005974466-How-to-Bypass-your-Internal-Doorbell-with-the-Pro-Power-Kit_V2-for-Ring-Video-Doorbell-Pro-,2018.

*Primary Examiner* — Rowina J Cattungal
(74) *Attorney, Agent, or Firm* — Christopher P. Maiorana, PC

(57) ABSTRACT

An apparatus includes a smart doorbell and a chime bypass circuit. The smart doorbell may comprise a battery and a switch for a chime. A power supply provides shared power to the chime and the smart doorbell. The battery provides a backup power supply for the smart doorbell when the shared power is insufficient. The chime bypass circuit may comprise a transistor configured to control an amount of the shared power for the chime and the smart doorbell, and a control circuit configured to generate a gate voltage for the transistor from the shared power. The transistor may be normally closed and opened periodically by the control circuit. Periodically opening the transistor may store the gate voltage to close the transistor. The transistor may control the amount of the shared power to ensure the chime does not produce undesired sounds when the chime is enabled in response to the switch.

20 Claims, 11 Drawing Sheets

(56) References Cited

U.S. PATENT DOCUMENTS

2015/0276239 A1\* 10/2015 Fadell ................ G05D 23/1905
237/2 A
2017/0025961 A1\* 1/2017 Seeman .................. H02M 1/08

\* cited by examiner

CHIME CONTROL COMPANION AND COMMUNICATION

This application relates to U.S. Provisional Application No. 62/807,996, filed Feb. 20, 2019. This application also relates to U.S. Provisional Application No. 62/789,113, filed Jan. 7, 2019. This application also relates to U.S. Ser. No. 16/143,853, filed Sep. 27, 2018, which relates to U.S. Ser. No. 16/111,669, filed Aug. 24, 2018, which relates to U.S. Provisional Application No. 62/661,341, filed Apr. 23, 2018, which are each hereby incorporated by reference in their entirety.

FIELD OF THE INVENTION

The invention relates to smart doorbells generally and, more particularly, to a method and/or apparatus for implementing chime control companion and communication.

BACKGROUND

Many homeowners are replacing conventional doorbell with a smart doorbell. For an easy do-it-yourself install, a desirable feature for smart doorbells is to use the door chime and the pre-existing doorbell wiring of the household as the power supply. Typically, conventional doorbells use a low voltage transformer of to 24 VAC. The smart doorbell may then be powered by the existing power supply and wiring and the existing chime(s) may serve as an annunciator(s) for visitors.

Door chimes are typically connected in series with the transformer, which results in the chime impedance limiting the power available to the smart doorbell. If the smart doorbell draws even a small portion of the current normally required to operate the door chime, a mechanical solenoid chime may respond with buzzing noises as the solenoid moves back and forth against the spring at the line frequency (60 Hz or 50 Hz) or at a harmonic or subharmonic of the line frequency. An electronic chime may also be activated or make undesired sounds at much lower currents than a smart doorbell requires for operation.

One typical solution to the problem of supplying the necessary current for operating a smart doorbell is to use a normally closed relay connected across the door chime that bypasses the door chime. Bypassing the door chime can supply more current to the smart doorbell when the door chime is not sounding. When the smart doorbell needs to sound the door chime, a switch is closed in the smart doorbell that increases the current flowing through the chime bypass. The increase in current is detected by the chime bypass and the relay is opened, typically for a fixed length of time. Opening the relay allows the chime to sound similar to closing a switch for a conventional mechanical doorbell.

There are several problems with existing normally closed relay chime bypass designs. One problem is that a fixed current threshold is typically detected to open the relay. Since current flowing can vary widely, having the fixed current threshold results in difficulty for tolerating a wide range of transformer voltages, different numbers of connected chimes, different chime mechanisms and/or electronic circuitry.

Another problem occurs due to the time delay required to operate typical relays, including solid state relays. Because the relay is normally closed, a surge current flows when the doorbell switch is first closed until the relay opens. The surge current can harm either the relay and/or the doorbell switch if not limited with protection circuitry, fuses, or other means.

Another problem occurs with electronic chimes that require a diode across the doorbell switch to provide standby power to the chime electronics. For the electronic chimes, a normally closed relay will not work, as the half-wave power required to "precharge" the chime electronics in the non-sounding state will be shorted out. Shorting out the chime electronics causes a distorted and/or delayed chime sound as the chime power is suddenly turned on fully.

Also, there are a limited number of manufacturers of otherwise little-used depletion mode field effect transistors (FETs) and solid state relays, so they are expensive.

It would be desirable to implement chime control companion and communication.

SUMMARY

The invention concerns an apparatus comprising a smart doorbell circuit and a chime bypass circuit. The smart doorbell circuit may comprise a battery and a switch for a door chime. A power supply provides shared power to the door chime and the smart doorbell circuit. The battery provides a backup power supply for the smart doorbell circuit when the shared power is insufficient. The chime bypass circuit may comprise a transistor configured to control an amount of the shared power for the door chime and the smart doorbell circuit, and a control circuit configured to generate a gate voltage for the transistor from the shared power. The transistor may be normally closed and opened periodically by the control circuit. Periodically opening the transistor may store the gate voltage to close the transistor. The transistor may control the amount of the shared power to ensure the door chime does not produce undesired sounds when the door chime is enabled in response to the switch.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing chime control companion and communication that may (i)

enable using an enhancement field effect transistor, (ii) implement a transistor as a negative resistance switch, (iii) operate a transistor that is normally closed and opened periodically to receive a gate voltage, (iv) implement a damper pad for a mechanical chime, (v) generate customized chime sounds, (vi) prevent chimes from making undesirable sounds, (vii) ensure a smart doorbell and a door chime each have sufficient power and/or (viii) be implemented as one or more integrated circuits.

Embodiments of the present invention may comprise a system configured to connect a smart doorbell to pre-existing wiring of a premises (e.g., household wiring used for a conventional doorbell). The smart doorbell may provide advanced features compared to a conventional doorbell. In addition to providing a switch to sound a door chime, the smart doorbell may provide advanced features such as video recording, package delivery detection, two-way audio, wireless communication of alerts, door lock control, etc. Details of the features of the smart doorbell may be described in association with U.S. patent application Ser. No. 16/111,669, filed Aug. 24, 2018, U.S. patent application Ser. No. 16/143,853, filed Sep. 27, 2018 and U.S. Provisional Application 62/789,113, filed Jan. 7, 2019 of which appropriate portions of each are hereby incorporated by reference.

The advanced features of the smart doorbell may consume power. For example, the smart doorbell may be always on and may constantly draw power. The advanced features of the smart doorbell may draw power away from the door chime. Drawing power away from the door chime may result in undesired sounds from the door chime. Similarly, the power to activate the door chime may draw power away from the smart doorbell. Embodiments of the invention may be configured to ensure that both the door chime and the smart doorbell receive sufficient power.

Figure 1:
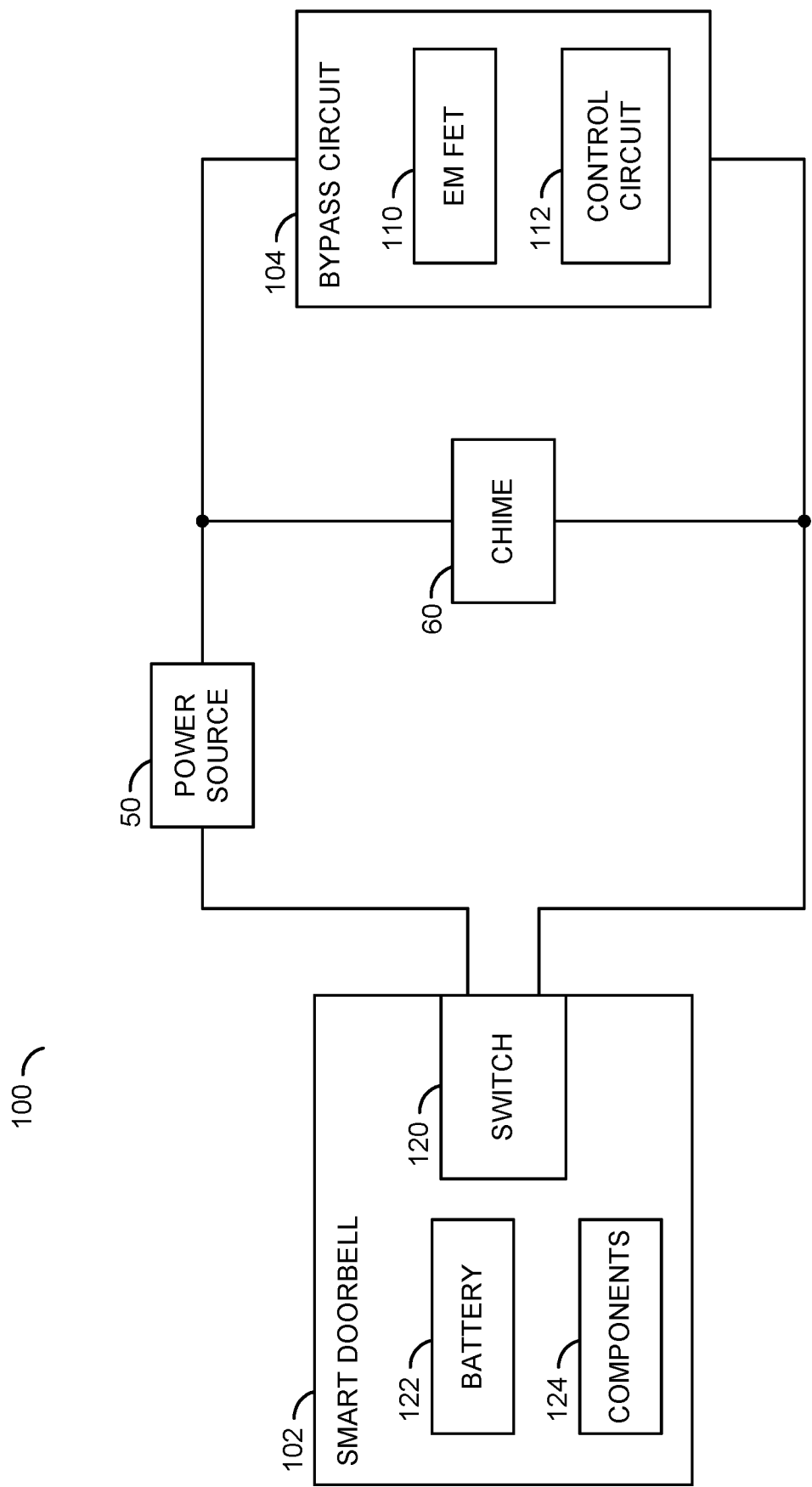
FIG. 1 is a diagram illustrating a block diagram of an embodiment of the present invention.

Referring to FIG. 1, a diagram illustrating a block diagram of an embodiment of the present invention is shown. An apparatus (or system 100) is shown. The apparatus 100 may comprise a block (or circuit) 50, a block (or circuit) 60, a block (or circuit) 102 and/or a block (or circuit) 104. The block 50 may represent a power source. The block 60 may implement a door chime. The block 102 may implement a smart doorbell circuit. The block 104 may implement a bypass circuit. The apparatus 100 may comprise other components (not shown). The number, type and/or arrangement of the components of the apparatus 100 may be varied according to the design criteria of a particular implementation.

The power source 50 may be an external power supply. The power supply 50 may be a household power supply. The power supply 50 may be a power supply used to power a conventional doorbell. For example, the homeowner may replace the conventional doorbell with the smart doorbell 102 using the apparatus 100 as a do-it-yourself (DIY) project. The type of the power supply 50 may depend on the location of the premises and/or local rules and regulations. In an example, the power supply 50 may comprise a low voltage transformer of 12 to 24 VAC operating at a line frequency of 60 Hz (or 50 Hz). The smart doorbell 102, the chime bypass circuit 104 and the chime 60 may be configured to be compatible with the power supply 50.

The chime 60 may be a door chime. The door chime 60 may be configured to generate an audible sound. Generally, the audible sound (e.g., "ding-dong") is generated in order to announce a visitor at the premises. In one example, the door chime 60 may be a mechanical solenoid chime. In another example, the door chime 60 may be an electronic chime. The door chime 60 may be a previously installed door chime for a household that may be re-used for the smart doorbell 102.

The bypass circuit 104 may comprise a block (or circuit) 110 and/or a block (or circuit) 112. The circuit 110 may be a transistor. In one example, the transistor 110 may be an enhancement mode field effect transistor (FET). The circuit 112 may be a control circuit. The bypass circuit 104 may comprise other components (not shown). The number, type and/or arrangement of the components of the bypass circuit 104 may be varied according to the design criteria of a particular implementation.

The smart doorbell 102 may comprise a block (or circuit) 120, a block (or circuit) 122 and/or a block (or circuit) 124. The circuit 120 may be a switch. The circuit 122 may be a battery. The circuit 124 may represent components. The switch 120 may be configured to activate the chime 60. The battery 122 may be a power supply for the smart doorbell 102. The components 124 may be configured to implement the functionality of the smart doorbell 102 (e.g., video recording, two-way audio communication, wireless communication, video analysis, etc.).

The smart doorbell 102 is shown connected in series with the power source 50. The smart doorbell 102 is shown connected in parallel with the chime 60 and the bypass circuit 104. The chime 60 may be connected in series with the power source 50. The bypass circuit 104 may be connected in series with the power source 50. The chime 60 may be connected in parallel with the bypass circuit 104. A first terminal of the power source 50 may be connected to a first terminal of the smart doorbell 102. A second terminal of the power source 50 may be connected to a first terminal of the chime 60 and a first terminal of the bypass circuit 104. A second terminal of the smart doorbell 102 may be connected to a second terminal of the chime 60 and a second terminal of the bypass circuit 104.

The chime 60 may receive power from the power source 50. The smart doorbell 102 may receive power from the power source 50. The power source 50 may be a shared power supply for the smart doorbell 102 and the chime 60. In one example, operations performed by the components 124 of the smart doorbell 102 may draw the available shared power from the power source 50 away from the chime 60. In another example, sounding the chime 60 may draw the available shared power from the power source 50 away from the smart doorbell 102. The bypass circuit 104 may also receive the shared power from the power source 50.

The battery 122 may provide a backup power supply for the components 124 of the smart doorbell 102. For example, when the chime 60 is activated, the shared power supply of the power source may be drawn away from the components 124. To prevent insufficient power to the components 124 of the smart doorbell 102, the backup battery 122 may supply the components 124 (e.g., on an as-needed basis). The battery 122 may be rechargeable. For example, when the chime 60 is in a non-active state, the battery 122 and the components 124 may be configured to receive power from the shared power source 50. When the chime 60 is active, the components 124 may receive power from the battery 122 (e.g., the available shared power from the power supply 50 may be insufficient). The components 124 may comprise circuitry configured to detect an amount of the shared power from the power supply 50 in order to determine when to activate the battery 122.

Figure 2:
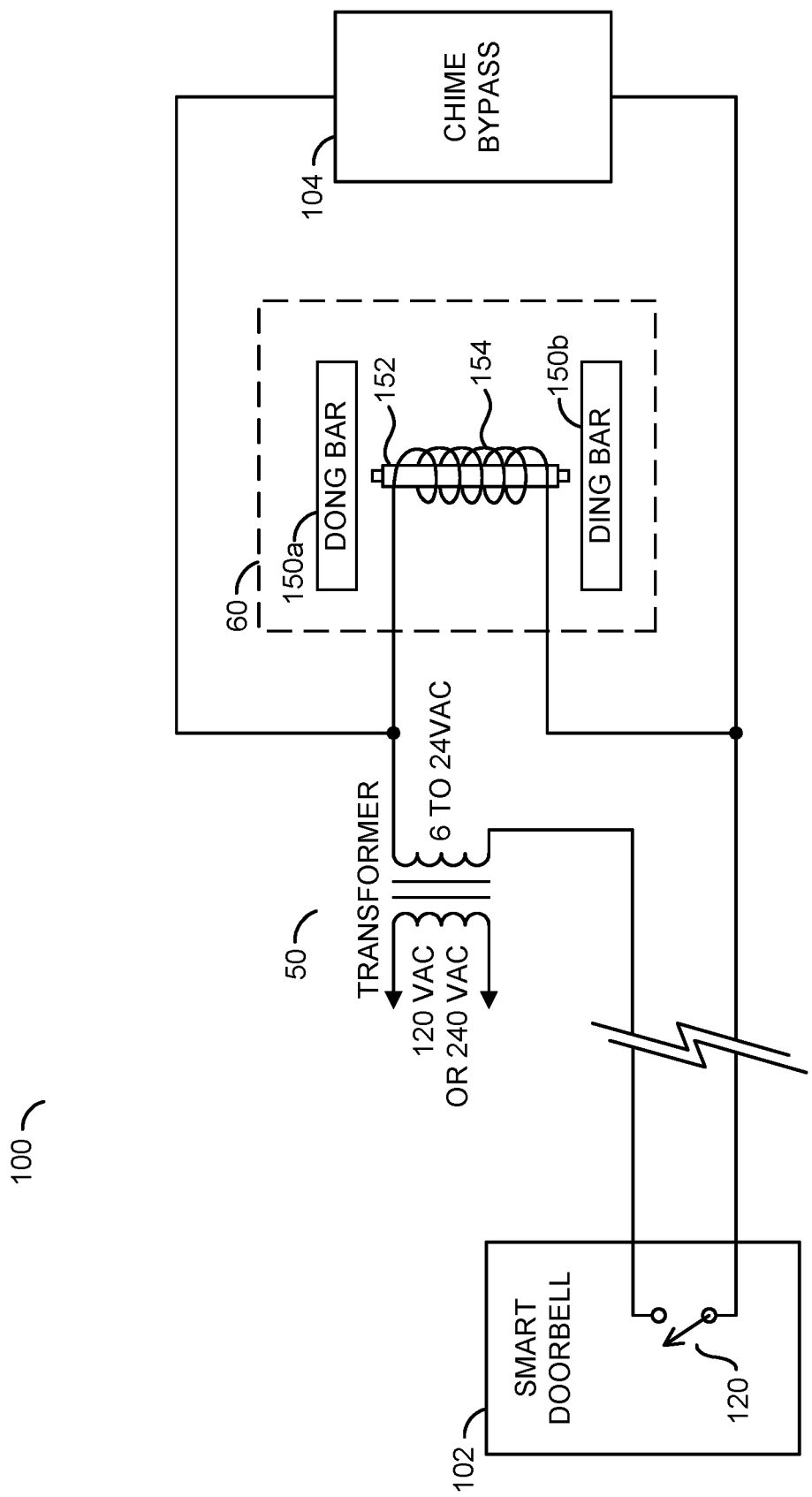
FIG. 2 is a diagram illustrating details of connections to the solenoid.

Referring to FIG. 2, a diagram illustrating details of connections to the solenoid is shown. The apparatus 100 is shown. The power source 50, the chime 60, the smart doorbell 102 and/or the chime bypass 104 are shown.

The shared power source 50 is shown as a transformer. In the example shown, the power source 50 may convert a 120 VAC (or 240VAR) supply to a power source of approximately 6V to 24V. A first terminal of the power source 50 is shown connected to the switch 120. A second terminal of the power source 50 is shown connected to the chime 60 and the chime bypass 104. Closing the switch 102 may connect the first terminal of the power source 50 to the second terminal of the chime 60 and the second terminal of the chime bypass 104.

Details of the chime 60 are shown. In the example shown, the chime 60 may be implemented as a mechanical solenoid door chime. The chime 60 may comprise bars 150a-150b, a solenoid core 152 and/or solenoid windings 154. When the switch 120 is closed, current generated by the power supply 50 may flow through the solenoid windings 154 to create an electromagnet. The electromagnetism may cause movement of the resonant bars 150a-150b. The movement of the bars 150a-150b may create the audible sound of the chime 60. The bar 150a may be a dong bar. The bar 150b may be a ding bar. For example, the familiar "ding-dong" sound of the chime 60 may be caused by activating the ding bar 150b first and then the dong bar 150a shortly after.

The apparatus 100 may be configured to power the smart doorbell 102 without causing undesired noise from the chime 60. The apparatus 100 may be configured to provide power to the smart doorbell 102 using an electrical current bypass implemented by the bypass circuit 104. The bypass circuit 104 may be configured to ensure the smart doorbell 102 is provided with sufficient power while ensuring that sufficient power is provided to the chime 60 when the switch 120 is closed.

In some embodiments, the bypass circuit 104 may be configured to detect when the switch 120 is closed. The bypass circuit 104 may be configured to sense a difference between the sinusoidal current and voltage waveforms through the chime 60 when the switch 120 is closed and the non-sinusoidal current and voltage waveforms through the chime 60 when the switch 120 is open (e.g., the components 124 of the smart doorbell 102 are requesting power).

The components 124 of the smart doorbell 102 may comprise a power converter configured to convert the AC power from the transformer 50 to DC. In one example, the components 124 may comprise diode(s) and an energy storage capacitor to implement the converter. During an initial phase of the AC cycle of the power supply 50 (e.g., from zero-crossing to the diode forward voltage drop plus the voltage remaining on the energy storage capacitor), the diode(s) do not conduct current. When the diode(s) do not conduct current, the voltage across the chime 60 may remain at a near zero plateau for several milliseconds (e.g., 10 ms or 8.33 ms) out of each AC half cycle (e.g., at 50 or 60 Hz, respectively).

In one example, the near zero plateau may be detected by the bypass circuit 104 by using a one-shot circuit that may be reset by voltages above a threshold (e.g., 3V) and trigger after a time delay (e.g., of approximately 1 to 2 milliseconds) at the near zero voltage. By detecting the near zero plateau, the bypass circuit 104 may operate without a fixed current threshold. Operating without the fixed current threshold may enable a wide range of transformer voltages and/or chime loads.

Figure 3:
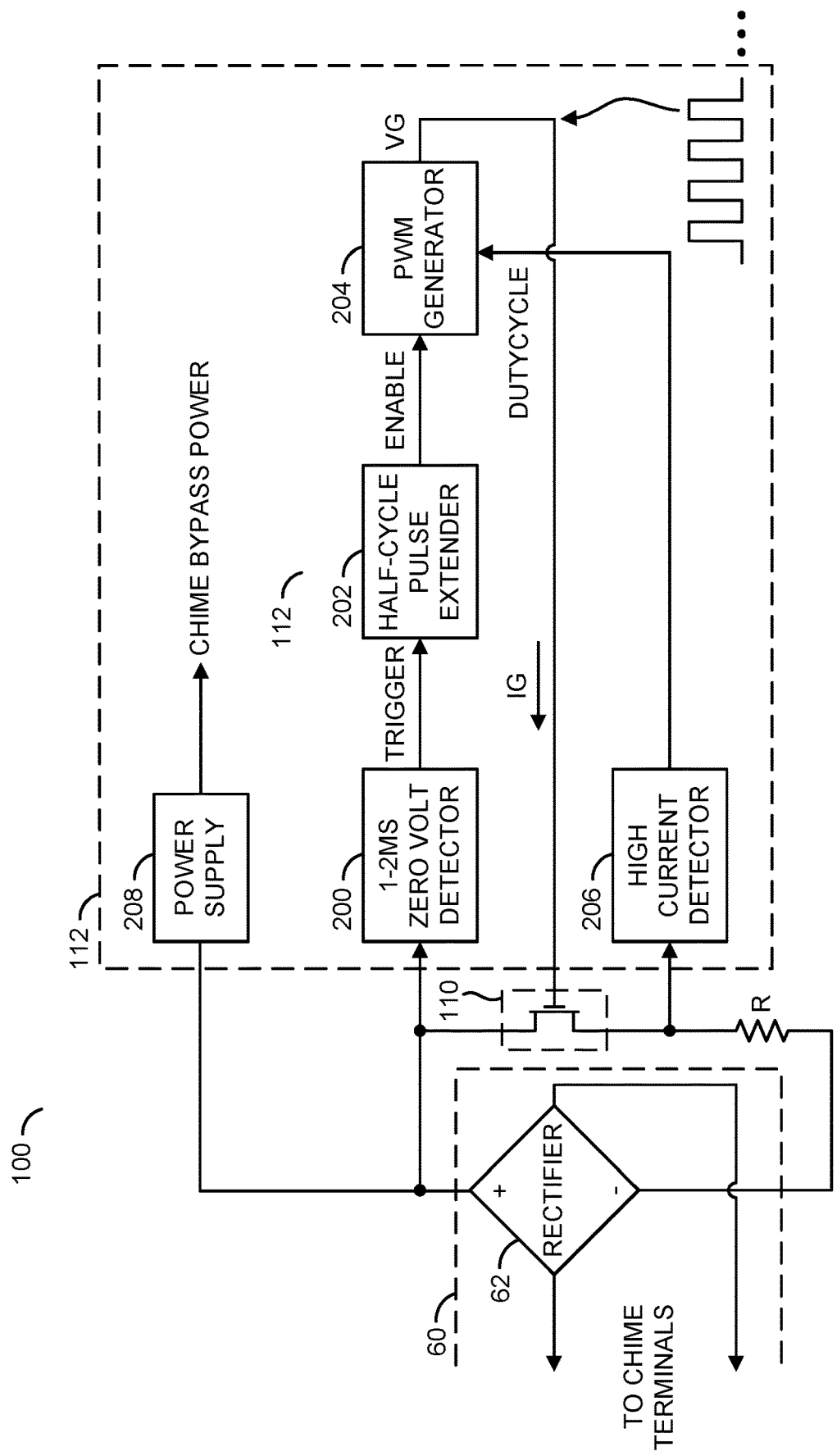
FIG. 3 is a diagram illustrating a chime bypass circuit.

Referring to FIG. 3, a diagram illustrating the chime bypass circuit 104 is shown. A portion of the apparatus 100 comprising the chime 60 and components of the bypass circuit 104 is shown. The chime 60 is shown comprising a rectifier 62. In the example shown, the chime 60 may be an electronic chime with the rectifier 62 implemented across the doorbell switch in order to provide standby power for the electronics of the chime 60.

The transistor 110 is shown. In one example, the transistor 110 may be an enhancement mode FET. The enhancement mode FET 110 may be an inexpensive component. The enhancement mode FET 110 may be configured to control an amount of the shared power from the power supply 50 provided to the smart doorbell 102 and the chime 60. The transistor 110 may controlling the amount of the shared power may enable the smart doorbell 102 to receive power from the power supply 50 and ensure that the chime 60 does not produce undesired sounds in response to closing the switch 120.

The control circuit 112 is shown. The control circuit 112 may comprise a block (or circuit) 200, a block (or circuit) 202, a block (or circuit) 204, a block (or circuit) 206 and/or a block (or circuit) 208. The circuit 200 may implement a zero volt detector. The circuit 202 may implement a pulse extender. The circuit 204 may implement a pulse width modulation (PWM) generator. The circuit 206 may implement a current detector. The circuit 208 may implement a power supply (e.g., a voltage regulator, energy storage capacitors and/or voltage multipliers). The control circuit 112 may comprise other components (not shown). The number, type and/or arrangement of the components of the control circuit 112 may be varied according to the design criteria of a particular implementation.

A first terminal of the transistor 110 may be connected to a positive terminal of the rectifier 62, an input of the zero volt detector 200 and an input of the power supply 208. A gate of the transistor 110 may be connected to an output of the PWM generator 204. A second terminal of the transistor 110 may be connected to a resistance R in series with a negative terminal of the rectifier 62 and connected to an input of the current detector 206.

The zero volt detector 200 may be configured to generate a signal (e.g., TRIGGER). The zero volt detector 200 may be configured to detect the zero volt plateau. In one example, the zero volt detector 200 may measure a supply voltage for the bypass circuit 104. The zero volt detector 200 may trigger (e.g., generate the signal TRIGGER) after approximately 1ms-2 ms at near zero voltage. In one example, the zero volt detector 200 may be implemented by a one-shot circuit.

The pulse extender 202 may be configured to receive the signal TRIGGER. The pulse extender 202 may be configured to generate a signal (e.g., ENABLE). The pulse extender 202 may implement a half-cycle pulse extender. In one example, the pulse extender 202 may be capacitor. The pulse extender 202 may store energy for closing the transistor 110 for a next cycle of closing the transistor 110.

The PWM generator 204 may be configured to receive the signal ENABLE. The PWM generator may generate a signal (e.g., VG). The signal VG may be a gate voltage for the transistor 110. The PWM generator may receive a signal (e.g., DUTYCYCLE). The signal VG may be a periodic signal (e.g., an intermittent signal). The signal DUTYCYCLE may control the duty cycle of the periodic signal VG.

The signal VG may be generated to keep the transistor 110 normally closed. The signal VG may be configured to open the transistor 110 periodically. Opening the transistor 110 periodically may enable the control circuit 112 to provide the gate voltage VG for a next cycle of closing the transistor 110. The pulse extender 202 may store the shared power from the power supply (e.g., provided via the rectifier 62) to provide the gate voltage VG for closing the transistor 110 for a next cycle. In one example, when the signal VG is asserted (e.g., an on time of the duty cycle), the transistor 110 may be closed and when the signal VG is not asserted (e.g., an off time of the duty cycle), the transistor 110 may be open.

The current detector 206 may generate the signal DUTY-CYCLE. The current detector 206 may be a high current detector. The high current detector 206 may be configured to detect the increased current flowing through the chime bypass 104 in response to closing the switch 120. When the increased current is detected, the current detector 206 may adjust the signal DUTYCYCLE to cause the PWM generator 204 to keep the transistor 110 open (e.g., for a fixed amount of time). Keeping the transistor 110 open may enable the chime to sound. In one example, the signal DUTYCYCLE may keep the transistor 110 open for approximately 10 ms to 1000 ms. In another example, the transistor 110 may be kept open for approximately 3 seconds after a large current has been detected through the smart chime switch 110. Keeping the transistor 110 open for the fixed amount of time of 3 seconds may be a tradeoff between preventing potential effects (e.g., undesired sounds) on the playback of quiet portions of the chime tune of a long (e.g., 8 second) chime tune when the chime 60 is an electronic door chime and how quickly the chime tune may be sounded twice in a row when the chime 60 is a mechanical chime.

The power supply 208 may be configured to provide the chime bypass power to the chime control circuit 112. In an example, the power generated by the power supply 208 may be internal to the control circuit 112. The power supply 208 may provide power to the components 200-206.

In one example, the transistor 110 may be implemented as an inexpensive enhancement mode FET. An amount of voltage (e.g., the signal VG) may be generated by the control circuit 112 for gate control of the transistor 110. The gate control implemented by the control circuit 112 may be varied according to the design criteria of a particular implementation.

In another example, the transistor 110 may be implemented as a BJT. For example, the bypass circuit 104 may be configured to store gate control energy for hundreds of milliseconds for the BJT. Generally, the bypass circuit 104 may be configured to power the smart doorbell 102 without using a depletion mode FET.

In the example shown, the control circuit 112 may briefly open the transistor 110 periodically. Opening the transistor 110 periodically may enable the shared power generated by the power supply 50 and received from the rectifier 62 to be rectified and stored by the control circuit 112. The control circuit 112 may be configured to store the energy from the higher voltage pulses that occur when the transistor 110 is open. A higher voltage than the average AC cycle voltage across the chime 60 may be produced by inductive kickback from the doorbell transformer 50 and/or from opening the transistor 110 briefly at or near the peaks of AC half-cycles. The average current flowing through the chime 60 may be kept low by using a low duty cycle for the signal VG for opening the transistor 110. Keeping a low average current flowing through the chime 60 may ensure that the electronics of the chime 60 are kept precharged when the chime 60 is in a non-sounding state to prevent an undesirable sound (e.g., to prevent a distorted and/or delayed chime sound).

In an example, the duty cycle may be 10% or less of opening the switch 120 (e.g., opening the transistor 110 for approximately 16 ms every 200 ms). In another example, the open duty cycle for the transistor 110 may be less than 1% of opening the switch 120. The bypass transistor 110 may be open for approximately 4 ms to 8 ms (e.g., until a 60 Hz AC cycle peak has occurred) to recharge the power supply 208 for the control circuit 112 at an interval of 8 seconds (or longer). Recharging the power supply 208 may be implemented to avoid clicks (e.g., undesired sounds) that may be audible in the electronic chime 60 that may have chime tunes that last up to 8 seconds (or longer).

The high current detector 206 may be configured to protect against surge current damage. The current detector 206 may adjust the signal DUTYCYCLE to provide a variable pulse width modulation of the chime bypass switch (e.g., the transistor 110). For example, the PWM generator 204 may vary the pulse width of the signal VG in response to the signal DUTYCYCLE. When the current detector 206 detects a current above a pre-determined damaging limit, the "on" duty cycle of the transistor 110 may be reduced to keep the current in a safe region.

The transistor 110 may be configured to operate as a negative resistance switch with hysteresis. For example, when there is high current flow, the transistor 110 may enable current flow out of the circuit and when there is low current flow, the transistor 110 may enable current flow into the circuit. Implementing the enhancement mode FET 110 to operate as normally closed may result in no voltage being present across the control circuit 112 for powering the gate of the transistor 110. The control circuit 112 may be configured to ensure that there is power to the gate of the transistor 110 to keep the transistor 110 normally closed. The control circuit 112 may open the transistor 110 every once in a while to recharge the circuits 200-208 to provide a power supply for the gate of the transistor 110. A gate current (e.g., IG) is shown. The gate current IG may be very small. Since the gate current IG is small, opening the transistor 110 may enable the control circuit 112 to store enough energy for the gate of the transistor 110 for a few seconds.

Intermittently opening the transistor 110 may provide the gate voltage VG. The control circuit 112 may be configured to detect an over-current and then open the transistor 110 when the current is high. The control circuit 112 may be configured to provide the smart doorbell 102 power at the resistance R by closing the transistor 110.

The smart doorbell 102 may switch from being powered by the shared power supply 50 to being powered by the battery 122 when the switch 120 is closed. Activating the chime 60 may draw power away from the components 124 of the smart doorbell 102. In an example, visitors may press the doorbell for 10 seconds. The battery 122 may be configured to provide the backup power supply for at least 10 seconds.

Figure 4:
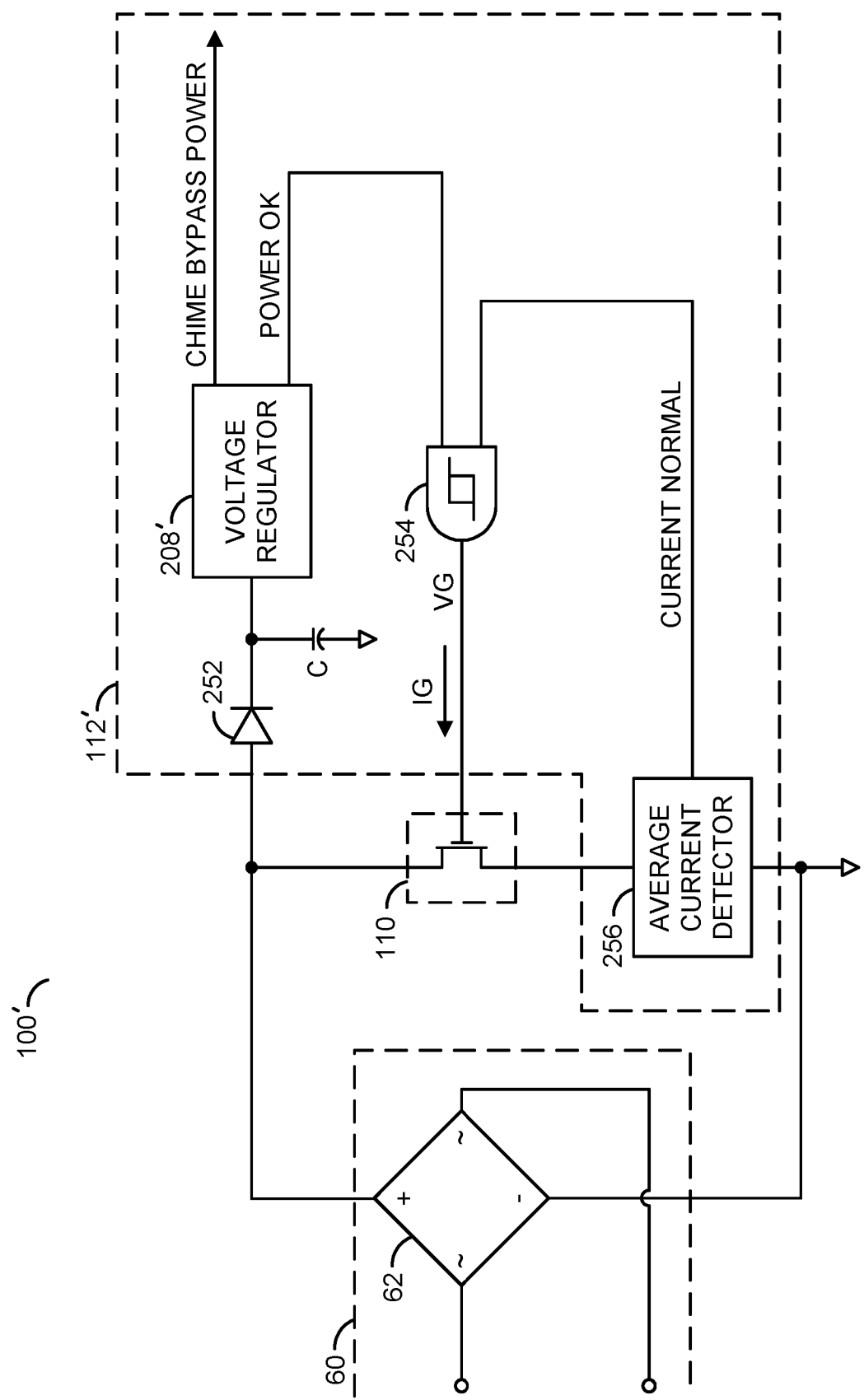
FIG. 4 is a diagram illustrating an alternate example of a chime bypass circuit.

Referring to FIG. 4, a diagram illustrating an alternate example of the chime bypass circuit 104 is shown. A portion of the apparatus 100' comprising the chime 60 and components of the bypass circuit 104 are shown. The alternate example of the chime bypass circuit 104 may have a similar implementation as shown in association with FIG. 3. The chime 60 is shown comprising the rectifier 62. In the example shown, the chime 60 may be an electronic chime with the rectifier 62 implemented across the doorbell switch in order to provide standby power for the electronics of the chime 60. The transistor 110 is shown. The transistor 110 may be the enhancement mode FET.

An alternative implementation of the control circuit 112' is shown. The control circuit 112' may use a diode-capacitor voltage multiplier to provide the gate control voltage for the transistor 110. The control circuit 112' may comprise a diode 252, a capacitance C, the voltage regulator 208', a block (or circuit) 254 and/or a block (or circuit) 256. The circuit 254 may implement a logic gate. In the example shown, the logic gate 254 may be an AND gate. The circuit 256 may implement an average current detector. The control circuit 112' may comprise other components. The number, type and/or arrangement of the components of the control circuit 112' may be varied according to the design criteria of a particular implementation.

The first terminal of the transistor 110 may be connected to the positive terminal of the rectifier 62 and the diode 252 (e.g., the power supply for the control circuit 112'). The gate of the transistor 110 may be connected to an output of the logic gate 254. The second terminal of the transistor 110 may be connected to the average current detector 256 in series with the negative terminal of the rectifier 62. The output of the average current detector 256 may be presented to the smart doorbell 102.

The transistor 110 may operate as normally closed. The transistor 110 may be opened intermittently (e.g., periodically). The rectifier 62 may receive the shared power supply from the power supply 50. The diode 252 may receive the shared power supply from the rectifier 62 and the capacitance C may provide filtering. The voltage regulator 208' may be configured to provide the chime bypass power to the components of the control circuit 112' (e.g., the AND gate 254, the average current detector 256 and/or other timing components).

The voltage regulator 208' may generate a signal (e.g., POWER OK). The signal POWER OK may be presented to a first input of the logic gate 254. The signal POWER OK may be generated in response to the voltage regulator 208' detecting a minimum threshold voltage value for powering the components of the control circuit 112'. In one example, where the logic gate 256 is an AND gate, when the minimum voltage value is detected, the voltage regulator 208' may provide the signal POWER OK as a logical "high" value to the first input of the logic gate 254. In another example, where the logic gate 256 is an AND gate, when the minimum voltage value is detected, the voltage regulator 208' may provide the signal POWER OK as a logical "low" value to the first input of the logic gate 254 (e.g., to open the gate of the transistor 110).

The average current detector 256 may detect the amount of current through the transistor 110. When the current is normal (e.g., the switch 120 has not been closed), the average current detector 256 may generate a signal (e.g., CURRENT NORMAL). The signal CURRENT NORMAL may be presented to a second input of the logic gate 254. In one example, where the logic gate 256 is an AND gate, when the average current is detected, the average current detector 256 may provide the signal CURRENT NORMAL as a logical "high" value to the second input of the logic gate 254. When the switch 120 is closed, the average current detector 256 may be configured to detect the increased current flowing through the chime bypass 104. In one example, where the logic gate 256 is an AND gate, when the high current is detected, the average current detector 256 may provide the signal CURRENT NORMAL as a logical "low" value to the logic gate 254 (e.g., to open the gate of the transistor 110).

The logic gate 254 may generate the gate voltage VG in response to the signal POWER OK and the signal CURRENT NORMAL. Most of the time, the signal POWER OK and the signal CURRENT NORMAL may be provided to enable the logic gate 254 to provide the gate voltage VG to the transistor 110 in order to keep the transistor 110 normally closed. When the average current detector 256 detects the high voltage surge caused by the closing of the switch 120, the state of the signal CURRENT NORMAL may change in order to disable the gate voltage VG and the transistor 110 may open (e.g., for a fixed amount of time). Keeping the transistor 110 open may enable the chime to sound. When there is insufficient power in the control circuit 112', the signal POWER OK may change in order to disable the gate voltage VG and the transistor 110 may open (e.g., periodically). The higher voltage pulses that occur when the transistor 110 is opened may be stored by the control circuit 112' in order to periodically open the transistor 110.

The gate of the transistor 110 may be controlled by the average bypass current being in a normal range (e.g., below the typically 400 mA RMS maximum, which might be consumed by the power supply of the smart doorbell 102) as opposed to the higher current which flows when the smart doorbell chime switch 120 is closed (e.g., the signal CURRENT NORMAL). The gate of the transistor 110 may be controlled by the internal power supply voltage (e.g., POWER OK) of the chime bypass 104 (e.g., above the Vgs threshold required to turn on the enhancement mode bypass FET). The POWER OK signal may turn off briefly when the capacitor C is discharged below a level set at (or above) the Vgs threshold.

The gate of the transistor 110 may be controlled by the logical AND of the signal CURRENT NORMAL and the signal POWER OK performed by the logic gate 254. The logic gate 254 may be further configured to perform hysteresis, which, along with the capacitor C (and other time delay elements not shown) may control the timing of the signal VG. Ideally, the circuitry of the chime bypass 104 may be designed to use low power (e.g., by using CMOS logic). Reducing power so that the POWER OK low signal duration is less than about one cycle of AC power and with a duty cycle of less than 10% (e.g., so that power supplies in electronic chimes are not affected by the momentary interruptions in current flow).

Other chime bypass embodiments may be implemented by the control circuit 104. In one example, instead of the transistor 110, the control circuit 104 may implement a resettable fuse. The resettable fuse may have a short trip time. For example, the short trip time may be less than 500 ms. In one example, a low thermal mass polyfuse may be connected across the chime 60 to open when the doorbell switch 120 is closed.

The resettable fuse may operate as a negative resistance similar to the transistor 110. The resettable fuse may be configured to trip within approximately 100 ms. Keeping the amount of time to trip the bypass circuit 104 may be important to ensure that the chime 60 responds quickly and responsively when the switch 120 is closed.

Figure 5:
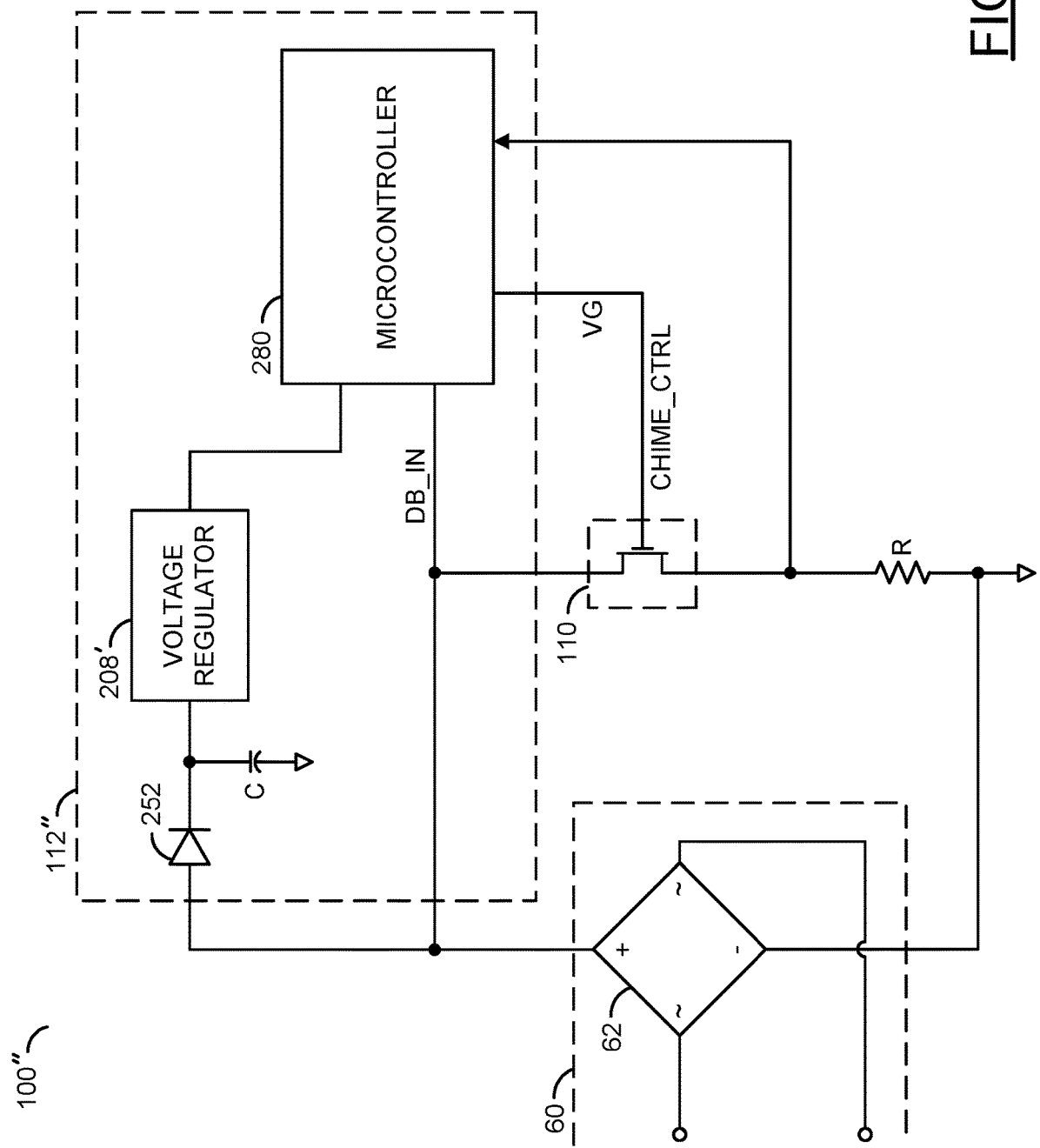
FIG. 5 is a diagram illustrating a transistor and a control circuit.

Referring to FIG. 5, a diagram illustrating the transistor 110 and the control circuit 112" is shown. A portion of the apparatus 100" comprising the chime 60 and components of the bypass circuit 104 are shown. The alternate example of the chime bypass circuit 104 may have a similar implementation as shown in association with FIG. 4. The chime 60 is shown comprising the rectifier 62. In the example shown, the chime 60 may be an electronic chime with the rectifier 62 implemented across the doorbell switch in order to provide standby power for the electronics of the chime 60. The transistor 110 is shown. The transistor 110 may be the enhancement mode FET. The average current detector 256 is shown. The alternate implementation of the control circuit 112" is shown.

The alternate implementation of the control circuit 112" may comprise the diode 252, the capacitance C, the voltage regulator 208' and/or a block (or circuit) 280. The block 280 may implement a microcontroller. The control circuit 112" may comprise other components (not shown). The number, type and/or arrangement of the components of the control circuit 112" may be varied according to the design criteria of a particular implementation.

The microcontroller 280 may be configured to control the gate voltage VG for the transistor 110. The microcontroller 280 may comprise circuitry configured to detect the amount of current and voltage in the bypass circuit 104. In one example, the microcontroller 280 may detect the amount voltage and/or current by sampling a voltage of the resistance R. The microcontroller 280 may be programmed to make adjustments to the gate voltage VG in response to the detected current and voltage in the bypass circuit 104.

The first terminal of the transistor 110 may be connected to the positive terminal of the rectifier 62, the diode 252 and an input of the microcontroller 280. The gate of the transistor 110 may be connected to an output of the microcontroller 280. The second terminal of the transistor 110 may be connected to an input of the microcontroller 280 in series with the resistance R and the negative terminal of the rectifier 62.

The transistor 110 may operate as normally closed. The transistor 110 may be opened intermittently (e.g., periodically). The rectifier 62 may receive the shared power supply from the power supply 50. The control circuit 112" may receive the shared power supply from the rectifier 62. The microcontroller 280 may measure current through the resistance R. The microcontroller 280 may be configured to receive the chime bypass power from the voltage regulator 208'. The microcontroller 280 may be configured to generate the gate voltage VG for the transistor 110.

The microcontroller 280 may be configured to directly measure current (e.g., as voltage across the resistance R) using an ADC input and arithmetically computing the average. In another example, the microcontroller 280 may implement an average current detector. The microcontroller 280 may use the information from the current measured in order to open the transistor 110 in order to enable the chime 60 to sound and/or prevent a damaging current surge.

The microcontroller 280 may be configured to manage the generation of the gate voltage VG in order to periodically open the transistor 110. The microcontroller 280 may be configured to provide the chime bypass power to the smart doorbell circuit 102 (e.g., by closing the transistor 110 to provide power at the resistor R). The microcontroller 280 may be further configured to control the operation of the chime 60.

In order to satisfy the half phase precharge for the electronic chime 60, the chime bypass 104 may be configured to respond within a few milliseconds to closure of the doorbell switch 120. The elements of the chime bypass 104 (e.g., whether implementing the embodiment shown in association with FIG. 3, FIG. 4 or FIG. 5, or using the resettable fuse) may be implemented with short time constant. Elements with short time constants may respond independently to each half-cycle of the AC power to enable half-cycle accurate control.

The microcontroller 280 is shown receiving a signal (e.g., DB_IN). The signal DB_IN may be an input provided by the smart doorbell 102. The signal DB_IN may be generated by the smart doorbell 102 in response to operations performed by the components 124. In one example, if the video analysis and/or object detection performed by the smart doorbell 102 detects package delivery, the signal DB_IN may be generated and/or adjusted to enable the microcontroller 280 to select a particular sound for the chime 60. In one example, the microcontroller 280 may be configured to measure a voltage across the bypass circuit 104 (e.g., when the transistor 110 is open) to adapt to different chime electronics and/or detect signaling (e.g., detect the signal DB_IN) from the smart doorbell 102. In another example, the microcontroller 280 may be configured to measure current at the input receiving the signal DB_IN when the signaling generated by the smart doorbell 102 is implemented as a variation in current.

The microcontroller 280 is shown generating a signal (e.g., CHIME_CTRL). The signal CHIME_CTRL may be an output provided to the chime 60. The signal CHIME_CTRL may be implemented to control the operation of the chime 60 (e.g., make customized chime sounds). In one example implementing a 2-wire hookup, the signal CHIME_CTRL may be a signal that controls the chime bypass switch transistor 120. In another example, the signal CHIME_CTRL may be communicated as a separate connection to control the sound of the chime 60.

Generally, the chime 60 is capable of communicating one sound effect. For example, the chime 60 is capable of creating the "DING DONG" sound to announce that a visitor has pressed the doorbell switch 120, or remaining silent. The signal CHIME_CTRL generated by the microcontroller 280 may enable the chime 60 to convey more information through additional sound effects.

The signal CHIME_CTRL may be generated to cause the chime 60 to play various sound effects (e.g., chosen sequence or rhythmic pattern). In one example, in response to the smart doorbell 102 detecting the arrival of a package delivery, the chime 60 may play a corresponding sound effect. For example, the smart doorbell may provide and/or adjust the voltage (or current) of the signal DB_IN to the microcontroller 280 to indicate that a package has been detected, and the microcontroller 280 may respond by generating the signal CHIME_CTRL to cause the chime 60 to play a "DING DING (delay) DONG" sound. Other "chime tunes" may be generated based on different variations of the signal CHIME_CTRL. For example, different sounds may be generated in order to indicate whether a visitor has a known (e.g., familiar) face, is wearing a delivery uniform and/or is an unknown stranger. The customized chime tunes may alert the homeowner and provide information (via different chime tunes) about what is at the door so the homeowner may better decide whether to come to the door. In one example, the customized chime tune for when the smart doorbell 102 detects a family member may be ding-ding-dong. In another example, the customized chime tune for when the smart doorbell 102 detects a friend (e.g., a familiar face) may be ding-ding-dong-dong. In yet another example, the customized chime tune for when the smart doorbell 102 detects an unknown visitor may be ding-ding-dong-dong-dong. The combination of sounds for the customized chime tunes may be varied according to the design criteria of a particular implementation.

In one example, certain visitors may be assigned a unique "chime tune". For example, the components 124 of the smart doorbell 102 may identify the visitor using facial recognition (e.g., match the visitor to a stored database of faces) and if the visitor has a corresponding unique "chime tune", the smart doorbell 102 may generate and/or vary the signal DB_IN and the microcontroller 280 may select the unique "chime tune". In another example, the electronic chime 60 may be powered off and on at various playback lengths, to produce just a "ding", a short "di", or "ding (delay) ding". The type of chime tunes generated by the microcontroller 280 may be varied according to the design criteria of a particular implementation.

The microcontroller 280 may generate the signal CHIME_CTRL in order to control the current of the chime solenoid 152. In some embodiments, the microcontroller 280 may measure the instantaneous inductance of the chime solenoid 152 as the armature position in the coil changes and the chime armature force and/or position may be controlled. By controlling the armature position and/or force, the microcontroller 280 may control the chime volume by controlling the impact force on the sounding bar(s) 150a-150b.

In some embodiments, the components 124 may track the arrival times of visitors. When multiple visitors arrive within a short amount of time, the signal DB_IN may be provided so that the microcontroller 280 may progressively lower volume settings (e.g., temporarily reducing volume may reduce the annoyance of multiple chime soundings and/or reduce the amount of power sent to the smart doorbell 102, for instance to recharge the battery (or supercapacitor) 122 used during chime sounds). Alternately, the signal DB_IN may provide instructions to progressively increase the volume of the chime 60 as more guests arrive and the house gets louder (e.g., to avoid missing the arrival of guests). Similarly, a louder chime sound may be used to indicate the arrival of an urgent visitor). In another example, if the doorbell switch 120 is pressed multiple times the volume may be increased to notify the homeowner of the arrival (e.g., in case the homeowner did not hear the previous volume of the chime 60). In yet another example, if the doorbell switch 120 is pressed multiple times, the volume may be decreased or silenced (e.g., to prevent the annoyance caused by a prank).

Figure 6:
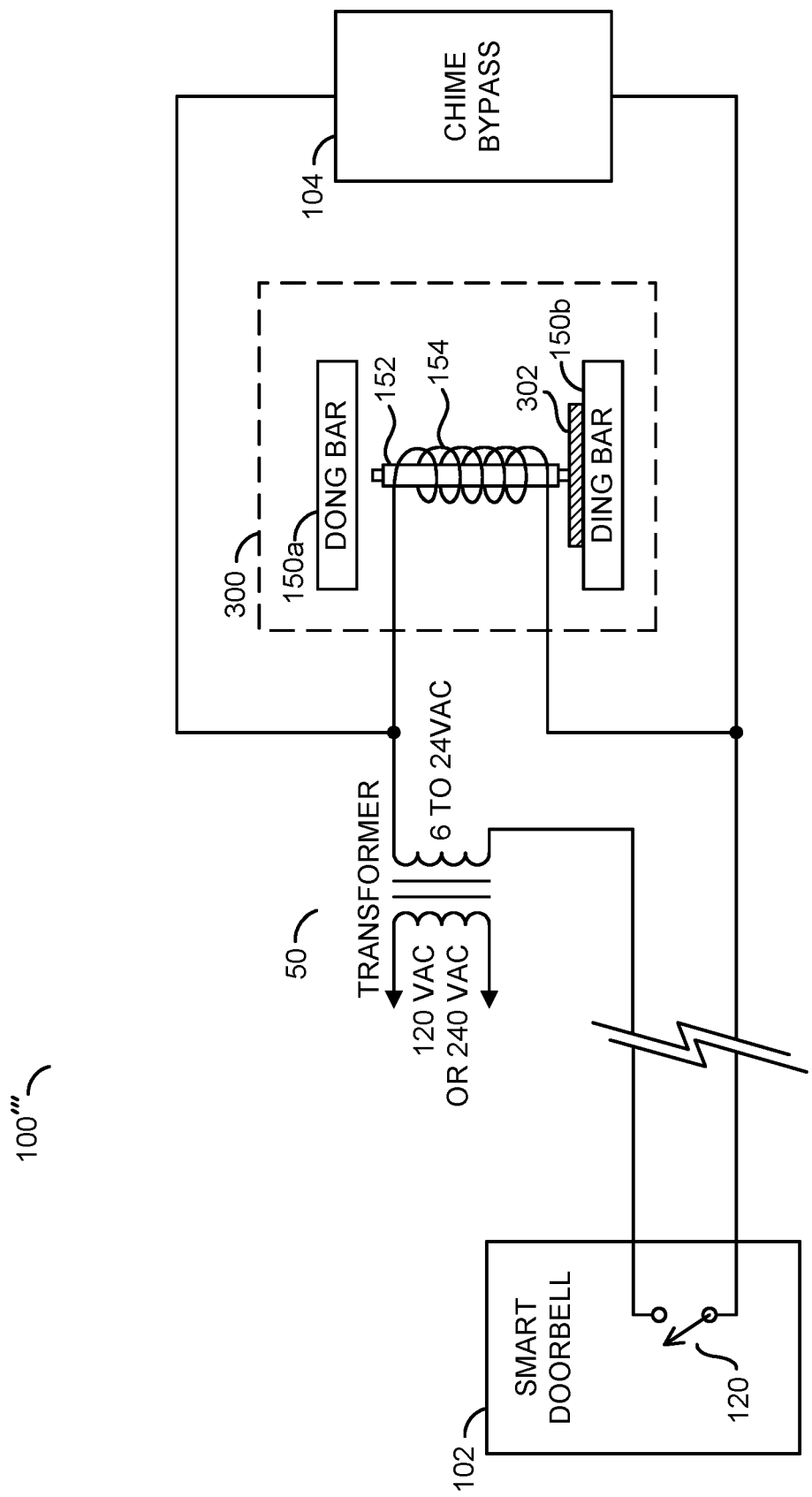
FIG. 6 is a diagram illustrating implementing an embodiment of the invention with a chime damper.

Referring to FIG. 6, a diagram illustrating implementing an embodiment of the invention with a chime damper is shown. The apparatus 100′″ is shown. The apparatus 100′″ may comprise the shared power supply 50, the smart doorbell 102, the chime bypass 104 and/or a block (or circuit) 300. The circuit 300 may be a mechanical door chime. The apparatus 100′″ may have a similar implementation as the apparatus 100 shown in association with FIG. 2.

The apparatus 100′″ may implement the mechanical door chime 300 with a damping pad. The mechanical door chime 300 may comprise the sounding bars 150a-150b, the solenoid core 152, the solenoid windings 134 and/or a damping pad 302. The damping pad 302 is shown attached to the 'DING' bar 150b.

The constant power that may be drawn for operation of the components 124 of the smart doorbell 102 without causing objectionable sounds from the mechanical chime 300 may be increased (e.g., by a factor of 2 or more) by installing the damper pad 302 between the ding end of the chime solenoid plunger 152 and the ding resonant bar 150b. The damper pad 302 may prevent resonant rattling of the striker in the solenoid 152 by absorbing any resonant motion energy build-up both vertically and horizontally before the sound may be heard. In one example, the material of the damper pad 302 may be selected to completely eliminate the "DING" sound. In another example, the damper pad 302 may be selected to only sound the "DING" at full solenoid striking force. When the damper pad 302 is implemented at the ding bar 150b, the "DONG" sound may still be available to alert the homeowner of a visitor.

Figure 7:
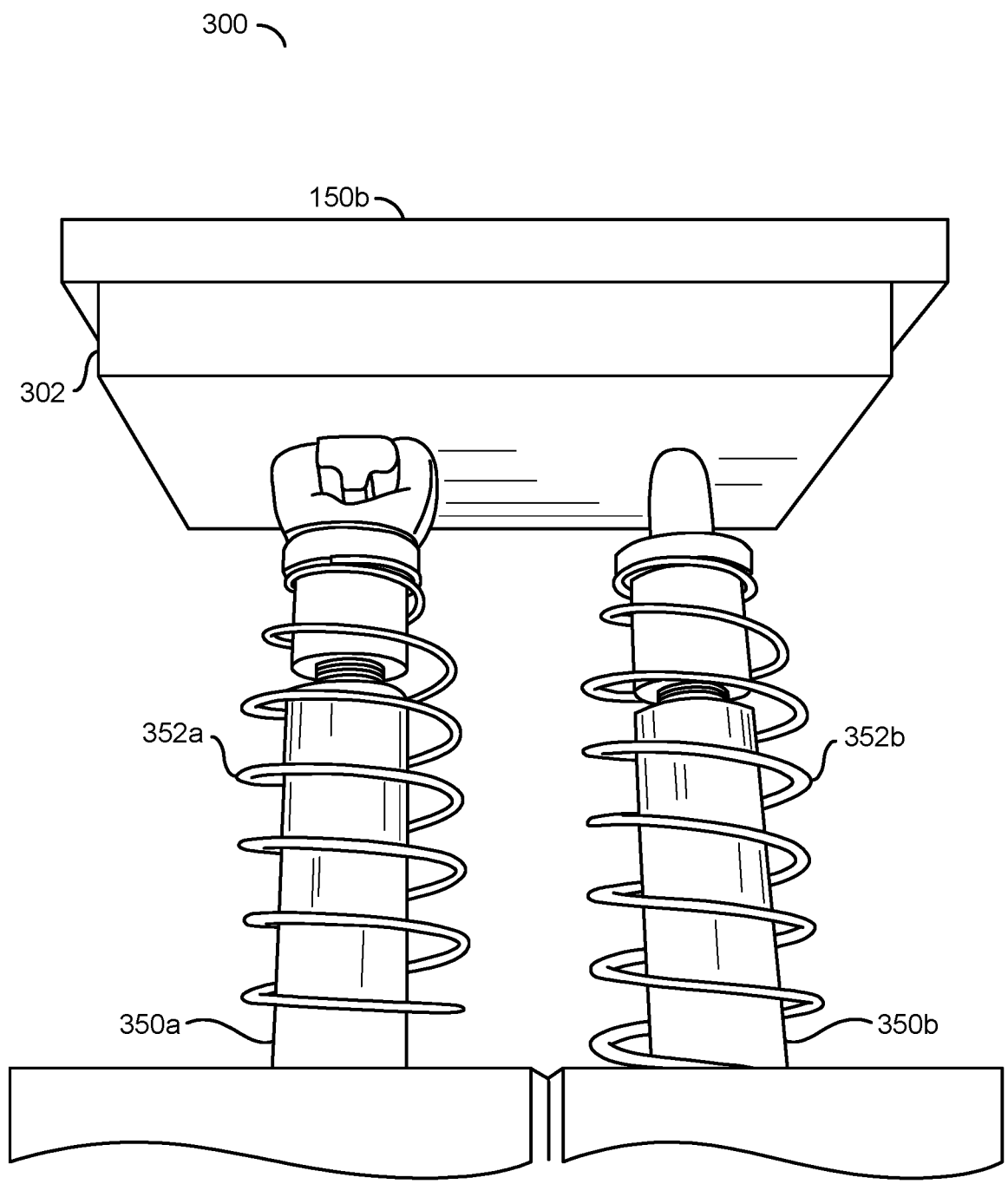
FIG. 7 is a diagram illustrating a chime damper.

Referring to FIG. 7, a diagram illustrating a chime damper is shown. A view of a portion the door chime 300 is shown. The portion of the door chime 300 shown may comprise the ding bar 150b, the damper pad 302, armatures 350a-350b and springs 352a-352b. Each of the armatures 350a-350b may have a corresponding one of the springs 352a-352b. The damping pad 302 is shown in between the ding bar 150b and the armatures 350a-350b.

The electromagnetic forces created by the shared power supply 50, solenoid core 152 and the solenoid windings 154 (not shown) may cause the springs 352a-352b to move the armatures 350a-350b. The armatures 350a-350b may be moved up or down by the springs 352a-352b. When the armatures 350a-350b move up or down the armatures 350a-350b may strike the dong bar 150a or the ding bar 150b. For example, the armatures 350a-350b may have timed movements to string the dong bar 150a then the ding bar 150b in succession to create the "DING-DONG" sound when the switch 120 is closed.

The damper pad 302 may be made of almost any compliant material with a good damping coefficient. Examples of the material for the damper pad 302 may comprise polyurethane foam, fiberglass, PVC, foam rubber, mass loaded vinyl, silicone, felt, etc. The material of the damping pad 302 may ideally be heat and fire resistant and/or treated to be fire resistant.

The damper pad 302 may be cut to fit various sizes of mechanical chimes. Generally, different mechanical chimes may have similar plunger stroke lengths of about 2 cm and a 6 mm resting space between the strikers 350a-350b and the ding resonant bar 150b where the damping pad 302 may be placed. In the example shown, the damping pad 302 may be cut to fit tightly between the rear door damping pad/ring mount and the ding bar 150b.

Generally, with the mechanical chime 60, enough power may go through the chime solenoid 152 without using the bypass circuit 104. Implementing the damper pad 302 may be an alternative to the bypass circuit 104. If power is reduced in the system (e.g., by reducing a functionality of the components 124), the mechanical chime may not make noise. For example, if more than 4 W are drawn from a 3 W-4 W doorbell then vibration may occur (e.g., the solenoid 152 may move). At 10 W there may be a DING sound. At 5 W-6 W there may be a DONG sound only. The damper pad 302 may enable more power headroom for the mechanical chime 300. The damper pad 302 may enable mechanical control to allow more current to flow through the chime solenoid 152 without making a sound.

Figure 8:
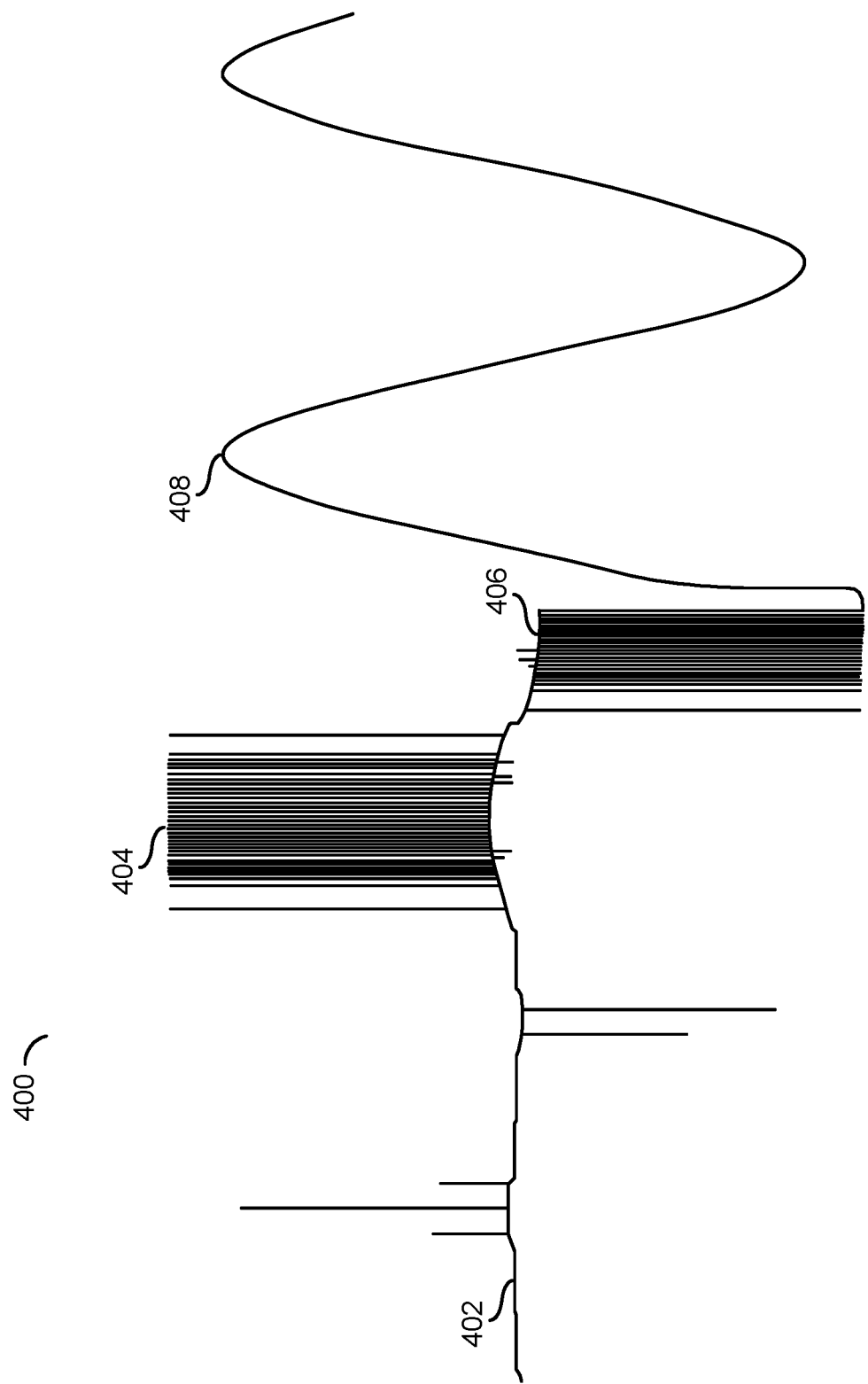
FIG. 8 is a graph illustrating an example chime current waveform.

Referring to FIG. 8, a graph illustrating an example chime current waveform is shown. A waveform 400 is shown. The waveform 400 may represent a chime current for the chime 60. In the example shown, the waveform 400 may have a first section 402, a second section 404, a third section 406 and a fourth section 408. The waveform 400 may be a representative example. The shape and/or amplitude of the waveform 400 may be varied according to the design criteria of a particular implementation.

The first section 402 may represent an off state of the chime 60. Generally, during the off state 402, the amplitude of the waveform 400 is near zero. For example, when the switch 120 is open, the shared power supply 50 may not be provided to the chime 60.

The second section 404 and the third section 406 may represent a current throttling state of the chime 60. The section 404 may be a positive portion of the current throttling state. The section 406 may be a negative portion of the current throttling state. During the current throttling state 404, the waveform 400 may reach a maximum positive amplitude and during the current throttling state 406, the waveform 400 may reach a maximum negative amplitude.

In one example, current throttling state 404-406 may be a result of the smart doorbell power supply plateaus/pulses.

The fourth section 408 may represent a switch on state of the chime 60. Generally, during the switch on state 408, the waveform 400 may be a sinusoidal signal. For example, when the switch 120 is closed, the shared power supply 50 may be provided to the chime 60. During the switch on state 408, the chime 60 may generate the desired audible sound.

In some embodiments, the apparatus 100 may be configured to perform low frequency (LF) radio frequency (RF) communication using the doorbell wiring. The doorbell wiring may also be used as an antenna for low frequency RF communication (e.g., on the 13.5 or 27.1 MHz worldwide ISM bands). Long wave RF bands may work well to communicate with AC powered auxiliary chimes and/or intercoms using AC power wiring as the other end of the antenna. Other AC wall socket plug in sensors and/or hubs such as temperature, water leak, intruder PIR, cameras, etc. may also work well with long wave RF.

Generally, dual pane windows have metal frame loops holding the glass panes. The apparatus 100 may be coupled with the metal frame to and serve as long wave RF antennae for window sensors. Wood frame doors may also use a long, thin wire taped to the inside of the door frame and/or edge of the door (e.g., hidden and protected) as a long wave RF antenna. Use of the doorbell wiring as a low frequency RF antenna may enable communication with power line devices and sensors, especially sensors located near metal window frames serving as long wavelength antennae.

The apparatus 100 may implement the enhancement mode FET switch 110. The gate of the enhancement mode FET 110 may be powered by the control circuit 112. The control circuit 112 may be configured to open the FET switch 110 as needed to store sufficient voltage to control the gate of the FET 110. In some embodiments, cheaper capacitors may be implemented in order to use nanowatts of power. Using only nanowatts of power may reduce the duty cycle of opening the FET switch 110 to provide power to the circuitry for the chime 60 and/or the smart doorbell 102. Using only nanowatts of power may enable the FET switch 110 to remain closed for long intervals (e.g., for 8 seconds or longer, depending on the length of the chime tune for the electronic chime 60). For example, the design of the bypass circuit 104 may implement CMOS gates and switched current detection.

For embodiments of the apparatus 100 using mechanical chimes, the damper pad 302 may be implemented. The damper pad 302 may increase the allowed power drawn through the chime 300 without noticeable (e.g., undetectable by a human) sound production. Control of the position of the armatures 350a-350b of the mechanical chime 300 may be implemented by pulse timing and/or solenoid inductance measurements (e.g., implemented by the microcontroller 280). Control of the position of the armatures 350a-350b may enable a variety of tune sequences and rhythms. Similarly, the microcontroller 280 may control the position of mechanical chime solenoid armatures 350a-350b by pulse timing and/or solenoid inductance measurements to enable use of the chime 300 as an audio producing speaker.

Figure 9:
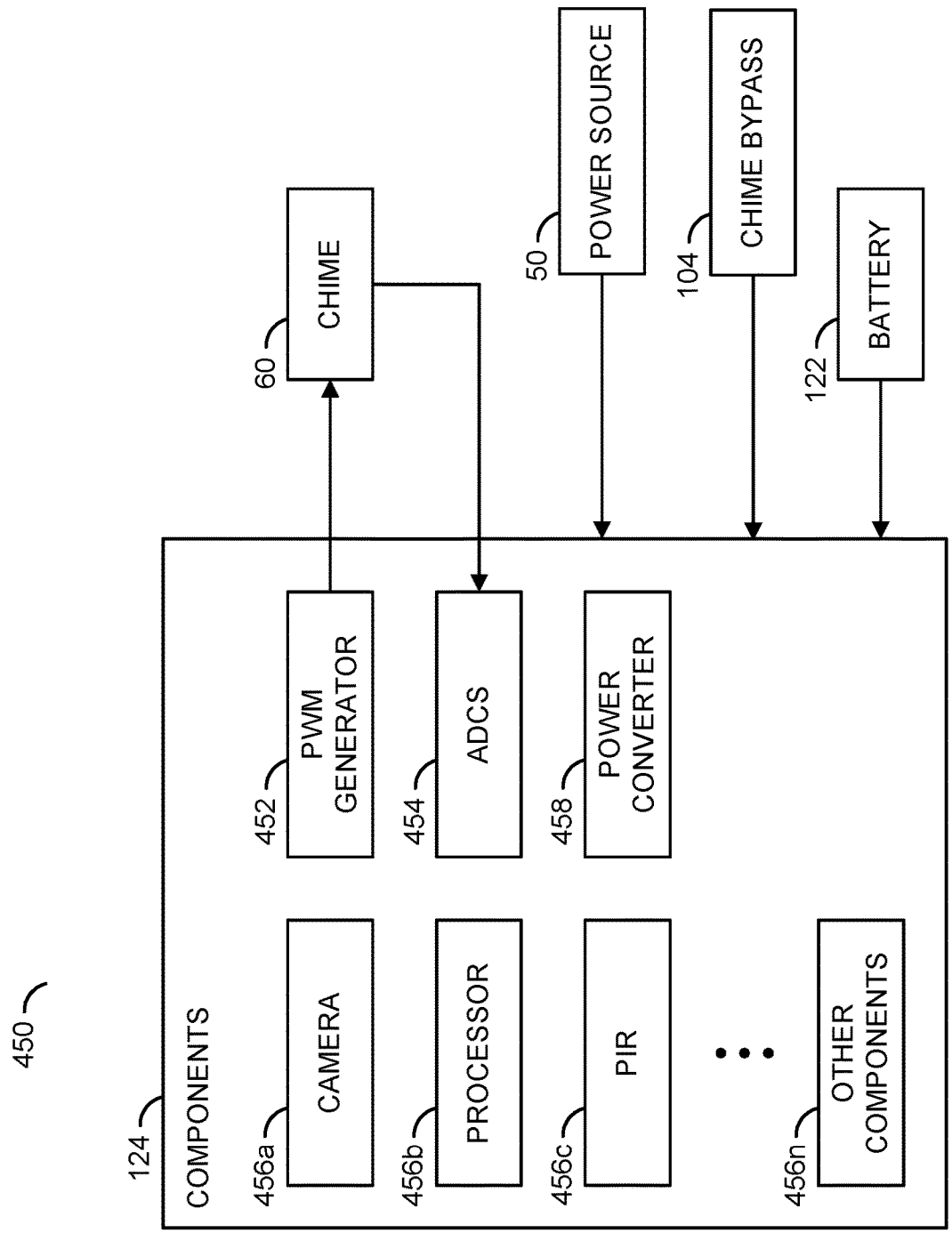
FIG. 9 is a block diagram illustrating controlling a door chime tune using a smart doorbell.

Referring to FIG. 9, a block diagram illustrating controlling a door chime tune using the smart doorbell 102 is shown. A block diagram 450 is shown. The block diagram 450 may represent various interconnections of the apparatus 100. The block diagram 450 may comprise the components 124 of the smart doorbell 102, the chime 60, the power source 50, the chime bypass circuit 104 and/or the battery 122 of the smart doorbell 102.

The components 124 of the smart doorbell 102 may comprise a block (or circuit) 452, a block (or circuit) 454, blocks (or circuits) 456a-456n and/or a block (or circuit) 458. The circuit 452 may implement a PWM generator. The circuit 452 may implement one or more analog-to-digital convertors (ADCs). The circuits 456a-456n may implement modules that perform the functionality of the smart doorbell 102. The circuit 458 may implement a power convertor. The components 124 of the smart doorbell 102 may comprise other modules. The type, arrangement and/or implementation of the modules of the components 124 of the smart doorbell 102 may be varied according to the design criteria of a particular implementation.

The PWM generator 452 may be configured to implement PWM modulation. The output of the PWM generator 452 is shown connected to the chime 60. The ADCs 454 may be configured to measure a voltage. For example, the ADCs 454 may receive a voltage input (e.g., an analog value) and convert the analog value to a digital value that may be read by a processor. The ADCs 454 may receive an input from the chime 60.

The modules 456a-456n may be configured to perform the various functionality of the smart doorbell 102. In the example shown, the module 456a may be a camera, the module 456b may be a processor and the module 456c may be a passive infrared (PIR) sensor. For example, the camera 456a may be configured to capture video frames of an area near the smart doorbell 102. In another example, the PIR sensor 456c may detect motion. Other components and/or modules 456n may be implemented (e.g., a wireless communication module, a microphone, a speaker, LEDs, etc.). The functionality of the modules 456a-456b may comprising sensing input and/or generating output (e.g., providing illumination).

The processor 456b may be configured to interpret input and/or execute computer readable instructions. For example, the processor 456c may be configured to perform video analysis on the video frames captured by the camera 456a in order to detect objects. The processor 456b may select a particular chime tune in response to the objects detected in the video frames. In one example, the processor 456b may analyze the video frames and perform facial recognition (or upload the video frames to a server that performs the facial recognition and then communicates the results back to the processor 456b) and if an unknown visitor is detected generate one chime tune (e.g., "ding-dong") and if a family member is detected generate another chime tune (e.g., "ding-ding-dong"). The processor 456b may adjust the output of the PWM generator 452 in order to generate the various chime tunes. The types of analysis performed by the processor 456b to select a chime tune may be varied according to the design criteria of a particular implementation.

The chime bypass 104 may be connected in parallel with the chime 60 in order to provide a current path around the chime 60. Other control features for the chime 60 may be implemented using the smart doorbell 102 (e.g., the switch transistor 122 in series with the chime 60). In one example, when the chime 60 is a mechanical chime, the position of the chime solenoid 152 may be controlled using PWM modulation provided by the PWM generator 452 and the chime current and/or voltage may be monitored using the ADCs 454. Using the PWM generator 452 and the ADCs 454 in the smart doorbell 102 may enable features such as detecting a doorbell wiring short and/or open circuits, generating alternate tune sequences, performing automatic detection of electronic chime tune lengths, signaling to and/or from the chime bypass 104 or other low-frequency RF receivers, and implementing use of some chimes as announcement speakers. The apparatus 100 may be configured to perform chime circuit monitoring and/or control using the smart doorbell 102.

The power convertor 458 may be configured to convert the AC power from the power source 50 to DC in order to provide DC power to the components 124. When the shared power source 50 is insufficient, the battery 122 may provide backup power for the components 122.

In some embodiments, the chime solenoid 152 may be used as a low fidelity speaker by keeping the armature in contact with or very near the "ding" sound bar 150b and modulating the current with an added audio signal generated by the microcontroller 280. In some embodiments, control of the chime solenoid 152 may be accomplished by modulating the doorbell switch and sensing the resulting voltage and current across and through the doorbell switch 120.

In one example, control of the timing of the chime bypass 104 (e.g., how long to open up to power the chime, chime volume, chime rhythm patterns, etc.) may be sent digitally as a serial signal modulating the current drawn by the doorbell and/or the voltage level (e.g., at kHz rates). The chime bypass 104 may be configured to utilize serial communication over the doorbell wiring to send diagnostic information, such as house voltage, current, chime armature stickiness, temperature, and/or be used for customer advice and support.

In some embodiments, modifications may be made to the smart doorbell 102 in order to control the amount of shared power consumed by the components 124. In one example, controlling the amount of power consumed by the components 124 may enable the apparatus 100 to operate without the chime bypass 104. In another example, the battery 122 may provide backup power to the components 124 when the shared power supply is insufficient for operating the full functionality of the components 124.

In some embodiments, to reduce power consumption by the components 124, the smart doorbell 102 may operate in a standby state. In the standby state, the video frame rate captured using the camera 456a may be reduced (e.g., 60 frames per second in a default state and 24 frames per second in the standby state) in order to reduce the video processing power consumed by the components 124. In one example, if detection at approximately 25 to 30 feet is desired and a person walks at about 5 feet per second, then video at 2 frames per second would only reduce the detection distance by at most 2.5 feet and an average of 1.25 feet. The video frame rate may be increased as the person or object detection probability increases (e.g., increasing the amount of power consumed as needed).

With variable video recording frame rates, the recorded pre-event (e.g., "preroll") video, when played back at a normal video frame rate, may automatically speed through the person or object approach time interval and slow down to normal when the person is near the door. Speeding through the object/person approaching may enable a longer pre-roll time to see where a person or object came from while eliminating the annoyance of watching a long approach at normal speed.

In some embodiments, to reduce power consumption by the components 124, the smart doorbell 102 illumination brightness may be set at a default lower state and then increased with detection probability. Reducing illumination may save power consumed by the components 124 and also serves as feedback to increase user confidence in the detection capabilities of the components 124 of the smart doorbell 102. During the daytime, the button 120 illumination might be completely off in standby mode, then turn on only as a visitor gets near (e.g., within 5 feet). At night, the IR illumination might be pulsed (e.g., at approximately 2 Hz) to obtain sharp images for person/object detection analysis. The illumination pulses may be synchronized with an increasing frame rate as the person or object gets closer.

In some embodiments, to reduce power consumption by the components 124, the package and/or porch illumination LEDs of the smart doorbell 102 may be pulsed or turned on only when a person and/or object is otherwise detected nearby. Ideally, the package and/or porch LEDs may turn off when there is no person present to avoid continually illuminating a package left on the porch and thus attracting thieves.

In some embodiments, when high temperatures for the battery 122 are detected (e.g., when afternoon summer sun hits the smart doorbell 102), the battery life may be extended by reducing the frame rate, turning off the radio(s), turning off all illumination and/or shutting down non-vital processes. For example, one of the components 124 may detect a temperature.

Figure 10:
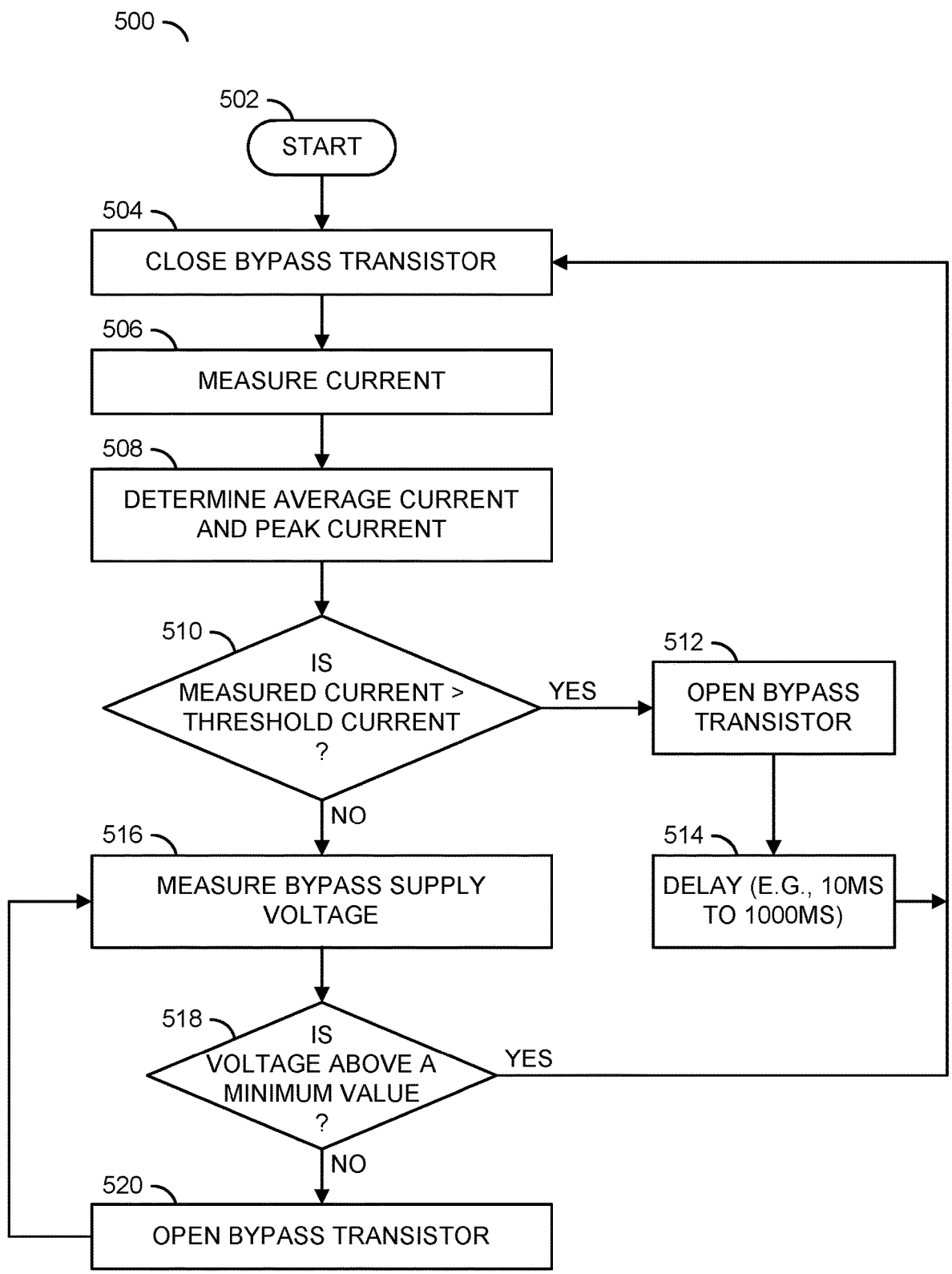
FIG. 10 is a flow diagram illustrating a method for performing chime control.

Referring to FIG. 10, a method (or process) 500 is shown. The method 500 may perform chime control. The method 500 generally comprises a step (or state) 502, a step (or state) 504, a step (or state) 506, a step (or state) 508, a decision step (or state) 510, a step (or state) 512, a step (or state) 514, a step (or state) 516, a decision step (or state) 518, and a step (or state) 520.

The step 502 may start the method 504. Next, in the step 504, the control circuit 112 may close the bypass transistor 110. In one example, the microcontroller 280 may close the transistor 110 by controlling the signal VG. Next, in the step 506, the control circuit 112 may measure the current through the transistor 110. In one example, the microcontroller 280 may measure a voltage across a resistance R in series with the transistor 110. In the step 508, the microcontroller 280 may determine the average current and the peak current through the transistor 110. Next, the method 500 may move to the decision step 510.

In the decision step 510, the microcontroller 280 may determine whether the measured current is greater than a threshold current. If the measured current is greater than the threshold current, the method 500 may move to the step 512. In the step 512, the control circuit 112 may adjust the signal VG to open the bypass transistor 110. Next, in the step 514, the microcontroller 280 may implement a delay. For example, the delay may be approximately 10 ms to 1000 ms to enable the chime 60 to generate the sound. Next, the method 500 may return to the step 504.

In the decision step 510, if the measured current is not greater than the threshold current, the method 500 may move to the step 516. In the step 516, the control circuit 112 may measure the bypass supply voltage. In one example, the microcontroller 280 may detect the output from the voltage regulator 208'. In another example, the microcontroller 280 may measure the signal DB_IN. Next, the method 500 may move to the decision step 518.

In the decision step 518, the control circuit 112 may determine whether the measured voltage is above a minimum value. For example, the minimum value may be the threshold voltage value for powering the components of the control circuit 112 (e.g., to prevent the control circuit 112 from having insufficient power). In one example, the minimum voltage threshold value for the bypass internal supply voltage may be approximately 3V to 4V. The minimum voltage threshold value may be chosen (e.g., pre-configured)

to provide a sufficient gate voltage (e.g., the signal VG) to the low-cost enhancement mode FET 110 in order to reduce a drain-source on resistance (e.g., $R_{DS\,(on)}$ of the FET 110) to a value of approximately 100 mOhms. Reducing the drain-source resistance to approximately 100 mOhms may ensure that the power dissipated by the transistor 110 is small at chime currents that may be on the order of 1 A.

In the decision step 518, if the measured voltage is above the minimum value, the method 500 may return to the step 504. If the voltage is not above the minimum value, the method 500 may move to the step 520. In the step 520, the control circuit 112 may open the bypass transistor 110. For example, the opening of the bypass transistor 110 may be the intermittent (or periodic) opening of the transistor 110 for a small amount of time in order to ensure that the control circuit 112 has sufficient power to keep the transistor 110 normally closed. Next, the method 500 may return to the step 516. The steps 516-520 may be repeated until the control circuit 112 has sufficient power for keeping the transistor 110 closed.

In some embodiments, the method 500 may be implemented using the microcontroller 280. Similarly, the method 500 may be implemented using alternate implementations of the control circuit 112 as shown in association with FIG. 3 and FIG. 4. The current threshold for the bypass switch 110 may adapt to a level between the long-term average current (e.g., with chime sound presumably off) and the peak current (e.g., when the smart doorbell switch 120 is briefly (e.g., for less than 10 seconds) closed to sound the chime 60).

Figure 11:
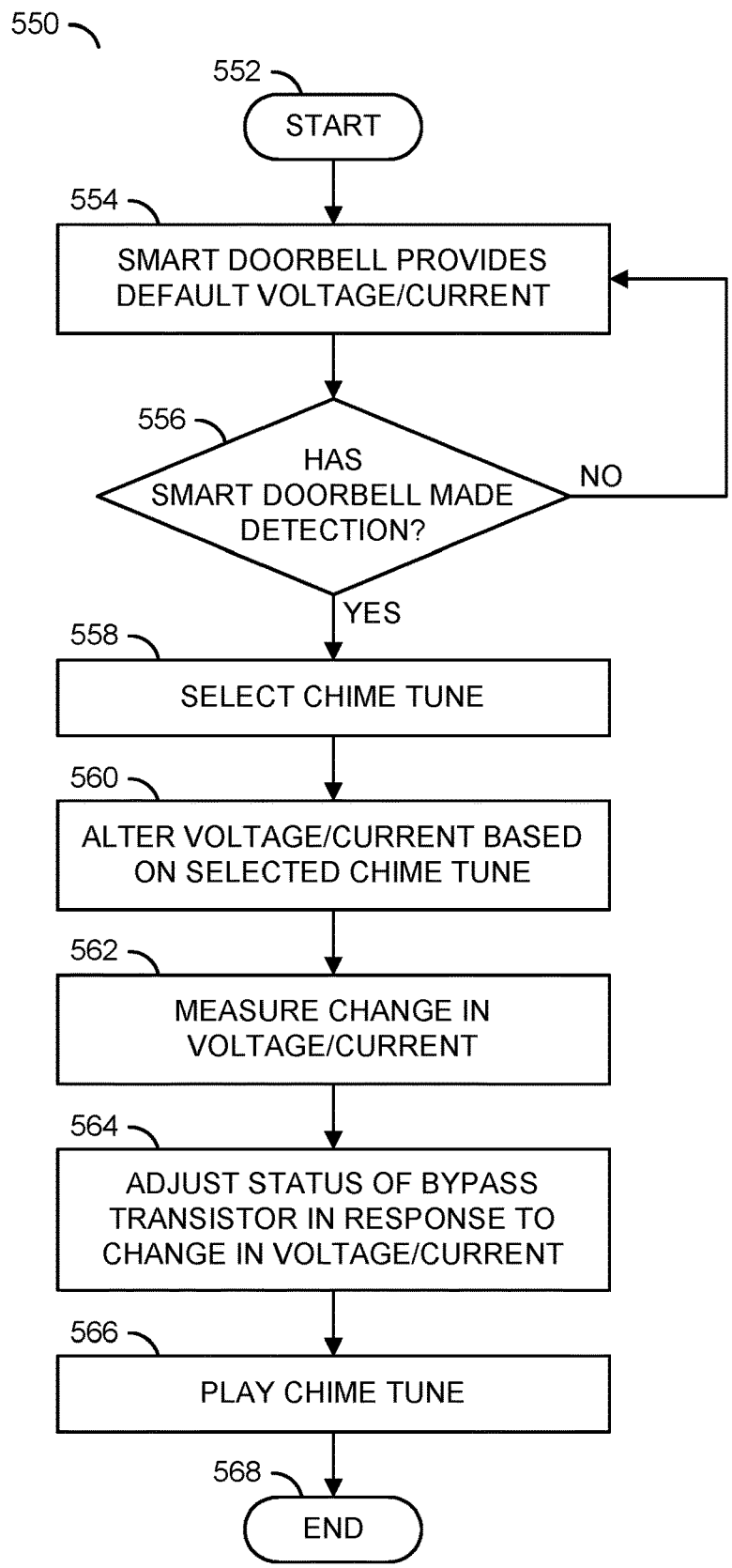
FIG. 11 is a flow diagram illustrating a method for selecting a chime tune.

Referring to FIG. 11, a method (or process) 550 is shown. The method 550 may select a chime tune. The method 550 generally comprises a step (or state) 552, a step (or state) 554, a decision step (or state) 556, a step (or state) 558, a step (or state) 560, a step (or state) 562, a step (or state) 564, a step (or state) 566, and a step (or state) 568.

The step 552 may start the method 550. In the step 554, the smart doorbell 102 may provide a default voltage and/or current. For example, the default voltage and/or current values may be the voltage and/or current values used for controlling the door chime 60 using the regular door chime sound (e.g., "ding-dong"). The microcontroller 280 may measure the current and/or voltage values of the signal DB_IN. Next, the method 550 may move to the decision step 556.

In the decision step 556, the processor 456*b* may determine whether the smart doorbell 102 has made a detection. In an example, the detection may be motion captured by the PIR sensor 456*c*. In another example, the detection may be determining that an object in the video frames captured by the camera 456*a* is a known person. In still another example, the detection may be audio captured using a microphone. Generally, the detection may be implemented by the components 124. If the detection has not been made, the method 550 may return to the step 554 (e.g., the apparatus 100 may operate using the default chime). If the detection has been made, the method 550 may move to the step 558.

In the step 558, the processor 456*b* may select the chime tune. For example, the chime tune may be selected in response to the type of detection made by the components 124. Next, in the step 560, the processor 456*b* may alter the voltage and/or current based on the selected chime tune. For example, the smart doorbell 102 may generate the signal DB_IN with characteristics that cause the microcontroller 280 to generate the selected chime tune. In one example, the signal DB_IN may be generated by the PWM generator 452. In the step 562, the microcontroller 280 may measure the change in the current and/or voltage values. For example, the microcontroller 280 may measure the signal DB_IN. Next, the method 550 may move to the step 564.

In the step 564, the microcontroller 280 may adjust the status of the bypass transistor 110 in response to the change in the voltage and/or current. For example, the microcontroller 280 may adjust the signal CHIME_CTRL (or VG) in response to the changes detected in the signal DB_IN. In the step 566, the chime 60 may play the chime tune selected according to the operation of the transistor 110. Next, the method 550 may move to the step 568. The step 568 may end the method 550.

The apparatus 100 may provide powering the smart doorbell 102 without generating undesired chime noises (e.g., buzzing, weak audio from a low-powered armature strike, delayed audio, etc.). The apparatus 100 may be configured to provide increased power to the smart doorbell 102 while still making power available to the chime 60.

The apparatus 100 may implement an electrical current bypass circuit 104. The bypass circuit 104 may comprise an inexpensive enhancement mode FET 110. The enhancement mode FET 110 may operate as normally closed and be powered by intermittently opening the enhancement mode FET 110 to provide gate voltage. In one example, the gate of the enhancement mode FET 110 may be closed by detecting the current waveform shape (e.g., detecting when smart doorbell power supply plateaus/pulses compared to the sine wave in response to closing the doorbell switch 120).

In some embodiments, the control circuit 112 may implement an alternate to the enhancement mode FET 110. In one example, the control circuit 112 may comprise a resettable fuse. In another example, the control circuit 112 may implement a microcontroller. For example, the microcontroller 280 may be configured to generate various chime tunes (e.g., generate alternate chime tune sequences). In an example, the microcontroller 280 may be configured to operate the chime solenoid 152 as a speaker.

In some embodiments, when the chime 60 is a mechanical chime, the apparatus 100 may be configured to mechanically control the sound. The apparatus 100 may implement the chime strike damper pad 302. The damper pad 302 may be configured to prevent resonant noise. The damper pad 302 may be configured to prevent low current/force strikes by the armatures 350*a*-350*b*. The damper pad 302 may be configured to enable high current/force strikes by the armatures 350*a*-350*b*.

In some embodiments, the smart doorbell 102 may be configured to operate such that the components 124 consume less power. For example, the components 124 may vary the video frame rate based on a probability of performing an object detection and/or based on a state of the battery 122. In another example, the components 124 may vary an amount of illumination provided based on a probability of performing an object detection and/or based on a state of the battery 122.

In some embodiments, the apparatus 100 may be configured to enable communication using doorbell wires. For example the doorbell wire may be implemented as an RF antenna.

Implementing the microcontroller 280 may enable the bypass circuit 104 to handle all the different transformer voltages, chime types and/or wiring resistances. The microcontroller 280 may further enable the advanced chime control features. In some embodiments, the chime current control may be implemented using PWM modulation of a transistor for the smart doorbell switch 120.

The functions performed by the diagrams of FIGS. 1-11 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a smart doorbell circuit comprising (a) a battery and (b) a switch for a door chime, wherein (i) a power supply provides shared power to said door chime and said smart doorbell circuit and (ii) said battery provides a backup power supply for said smart doorbell circuit when said shared power is insufficient; and
   a chime bypass circuit comprising (a) a transistor configured to control an amount of said shared power directed to said door chime and said smart doorbell circuit and (b) a control circuit configured to generate a control signal providing a gate voltage for controlling said transistor, wherein (i) said transistor is coupled in parallel with said door chime to said power supply, (ii) said transistor is (a) held in a normally closed state by said control circuit to direct said shared power to said smart doorbell circuit, (b) opened by said control circuit when said switch in said smart doorbell circuit is closed to direct said shared power to said door chime, and (c) opened periodically by said control circuit to maintain a supply voltage for said control circuit from said shared power, and (iii) said transistor controls said amount of said shared power directed to said door chime and said smart doorbell circuit to ensure said door chime does not produce undesired sounds when said door chime is enabled in response to said switch.

2. The apparatus according to claim 1, wherein said transistor is an enhancement mode field effect transistor.

3. The apparatus according to claim 1, wherein said transistor implements a negative resistance switch with hysteresis.

4. The apparatus according to claim 1, wherein (i) said door chime draws said shared power from said smart doorbell circuit when said switch is closed and (ii) said backup power supply ensures said smart doorbell circuit has sufficient power.

5. The apparatus according to claim 1, wherein said transistor is normally closed to (i) provide said shared power to said door chime in order to precharge electronics for said door chime when said switch is open and (ii) enable current to activate said door chime when said switch is closed.

6. The apparatus according to claim 1, wherein said apparatus does not operate with a fixed current threshold.

7. The apparatus according to claim 1, wherein said apparatus is configured to adapt to a wide range of transformer voltages and loads of said door chime.

8. The apparatus according to claim 1, wherein said control circuit is implemented by a microcontroller.

9. The apparatus according to claim 8, wherein (i) said microcontroller is configured to receive information from said smart doorbell circuit and (ii) generate a chime sound in response to said information.

10. The apparatus according to claim 9, wherein said smart doorbell circuit generates said information by adjusting at least one of (a) a voltage and (b) a current that is measured by said microcontroller.

11. The apparatus according to claim 8, wherein said microcontroller is configured to control a sequence of sounds generated by said door chime.

12. The apparatus according to claim 11, wherein said microcontroller is configured to control said sequence of sounds by controlling at least one of (a) a timing of armature strikes and (b) a force of armature strikes.

13. The apparatus according to claim 1, wherein said control circuit comprises a logic gate and an average current detector.

14. The apparatus according to claim 13, wherein said control circuit controls said transistor in response to a logical AND operation performed by said logic gate of (a) a current measured by said average current detector and (b) an amount of power available to said control circuit.

15. The apparatus according to claim 1, wherein said control circuit comprises a voltage detector, a pulse width modulation generator and a current detector.

16. The apparatus according to claim 15, wherein (i) said current detector is configured to adjust a duty cycle of an output of said pulse width modulation generator and (ii) said output of said pulse width modulation generator is configured to control said transistor.

17. The apparatus according to claim 1, wherein (i) said smart doorbell circuit comprises a pulse width modulation generator and an analog-to-digital convertor configured to control a position of a solenoid of said door chime and (ii) said pulse width modulation generator and said analog-to-digital convertor enable said smart doorbell to customize sounds generated by said door chime.

18. The apparatus according to claim 1, wherein said control circuit is configured to use nanowatts of power in order to enable said transistor to remain closed for long intervals.

19. An apparatus comprising:
an enhancement mode field effect transistor (FET) configured to control an amount of a shared power supply provided to a door chime circuit and a smart doorbell circuit in order to (i) precharge said door chime circuit when a switch is open and (ii) prevent said door chime circuit from generating an undesired sound because of a current draw of said smart doorbell circuit when said switch is closed; and
a control circuit configured to (i) generate a control signal providing a gate voltage for controlling said enhancement mode FET and (ii) periodically open said enhancement mode FET by controlling said gate voltage, wherein (a) said control circuit stores said shared power used for generating said gate voltage when periodically opening said enhancement mode FET, (b) said control circuit providing said gate voltage enables said enhancement mode FET to be normally closed, and (c) said control circuit operating said enhancement mode FET as normally closed enables said shared power to precharge said door chime while providing said shared power to said smart doorbell circuit.

20. The apparatus according to claim 19, wherein said control circuit is further configured to open said enhancement mode FET when said switch is closed to direct said shared power to said door chime.

* * * * *